(12) United States Patent
Dhuria et al.

(10) Patent No.: US 8,863,052 B1
(45) Date of Patent: Oct. 14, 2014

(54) SYSTEM AND METHOD FOR GENERATING AND USING A STRUCTURALLY AWARE TIMING MODEL FOR REPRESENTATIVE OPERATION OF A CIRCUIT DESIGN

(71) Applicant: Cadence Design Systems, Inc., San Jose, CA (US)

(72) Inventors: Amit Dhuria, Uttar Pradesh (IN); Naresh Kumar, Uttar Pradesh (IN); Umesh Gupta, Uttar Pradesh (IN); Pradeep Yadav, Uttar Pradesh (IN); Prashant Sethia, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/940,576

(22) Filed: Jul. 12, 2013

(51) Int. Cl.
*G06F 17/50* (2006.01)
(52) U.S. Cl.
CPC ................................ *G06F 17/5045* (2013.01)
USPC ........................... 716/108; 716/113; 716/134

(58) Field of Classification Search
CPC ............ G06F 17/5031; G06F 17/5022; G06F 17/505; G06F 17/45; G06F 17/5036; G06F 17/5068; G06F 17/5054
USPC .......................................... 716/108, 113, 134
See application file for complete search history.

(56) References Cited

U.S. PATENT DOCUMENTS 6,836,753 B1 * 12/2004 Silve ................................ 703/2

\* cited by examiner

*Primary Examiner* — Vuthe Siek
(74) *Attorney, Agent, or Firm* — Rosenberg, Klein & Lee

(57) ABSTRACT

A system and method are provided for generating a structurally-aware timing model for operation of a predetermined circuit design. The timing model is generated to have a plurality of timing arcs representing timing characteristics of the circuit design. Additionally, terminal pairs of the circuit design are evaluated to determine characteristic structural weights for selected paths through the circuit design. The structurally-aware timing model may then be incorporated into a top-level hierarchical circuit design for timing analyses and pessimism removal to arrive at realistic timing characteristics. The structural weights are particularly helpful in an AOCV-type pessimism removal post-process.

18 Claims, 22 Drawing Sheets

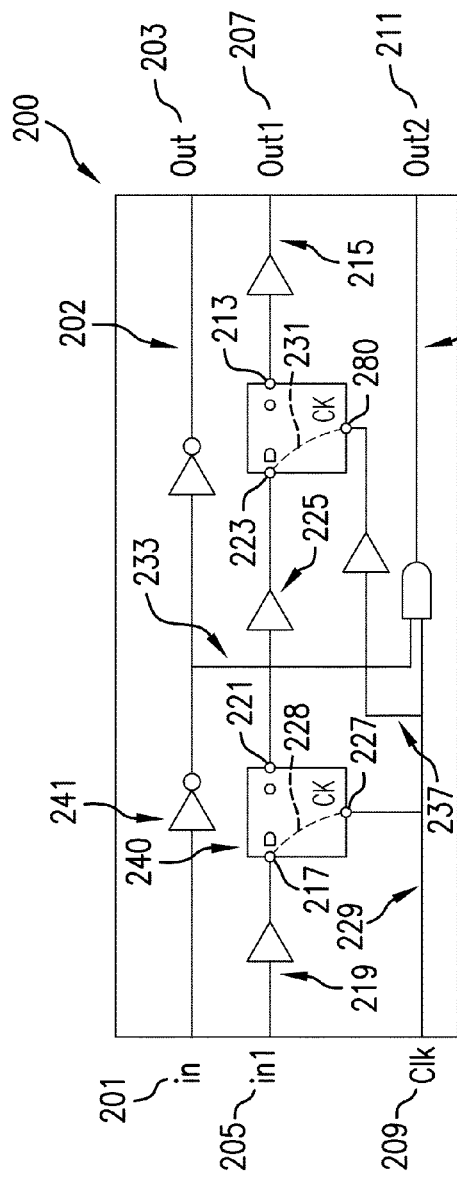
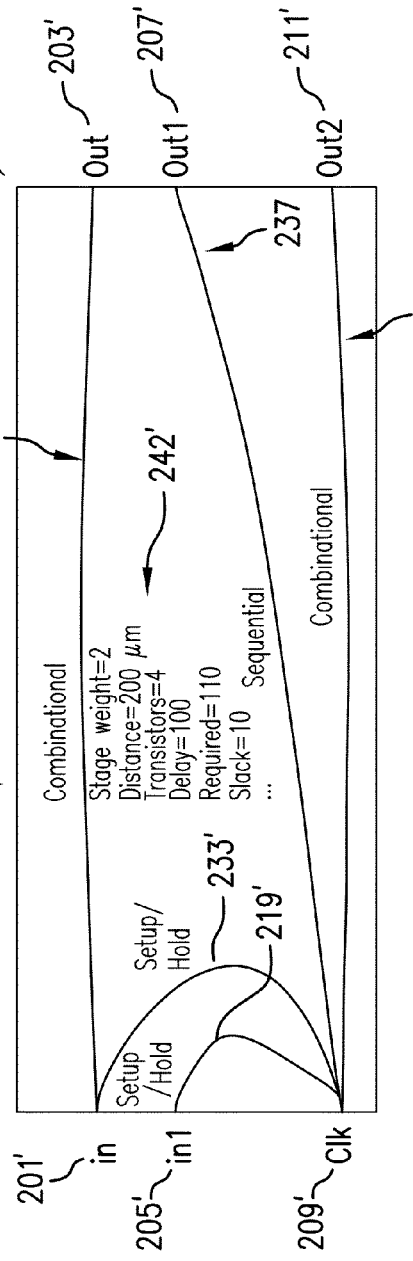
FIG. 2
FIG. 3

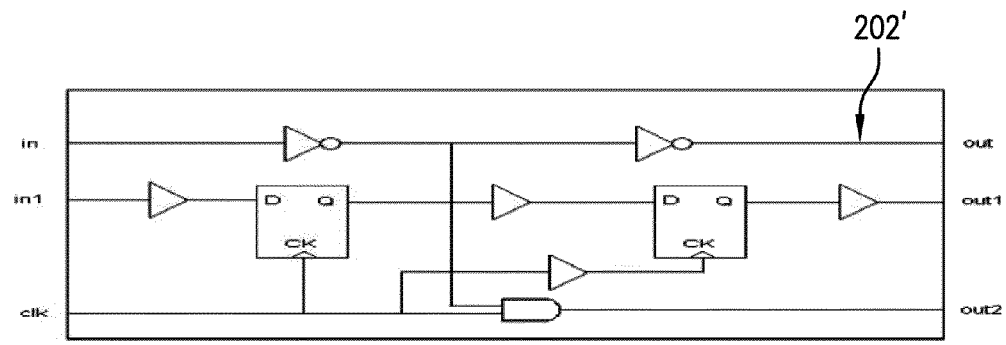

FIG.4

```
####################################################################
# write_model_timing report
# Design : netlist = .//case1.v topcell = set_propagated_clock_tc2

Analysis Mode : setup

####################################################################
####################################################################
# Section 1 : Worst Case Arcs
# Analysis Mode : setup
# Description : worst case arcs

# From        To         Arc Type              Transition    Arc-Delays    Stageweight
####################################################################
in           out        max_combinational fall/fall            9.857          2
in           out        max_combinational rise/rise  9.612                    2        ← 202''
in           out2       max_combinational fall/fall            4.811          2        ← 202'''
in           out2       max_combinational rise/rise  4.111                    2
clk          out2       max_combinational fall/fall            3.210          2
in1          clk        setup                        fall/rise  1.200          1
in1          clk        setup                        rise/rise  1.782          1
clk          out1       max_sequential     rise/fall  3.412                   ...
clk          out1       max_sequential     rise/rise  3.202
```

FIG.5

SYSTEM AND METHOD FOR GENERATING AND USING A STRUCTURALLY AWARE TIMING MODEL FOR REPRESENTATIVE OPERATION OF A CIRCUIT DESIGN

BACKGROUND OF THE INVENTION

The present invention is generally directed to electronic design automation (EDA) for creating integrated circuit (IC) products, such as, for example, system on chip (SOC) IC products and the like. More specifically, the present invention is directed to providing a structurally aware timing model to representatively model operation of a circuit design. Such timing model allows for incorporation as a black box or functional block into an overarching hierarchical circuit design.

While circuit design modeling systems and methods are generally known, such heretofore known systems and methods are encumbered by numerous deficiencies, not the least of which are the inability to accurately perform sign off, pessimism reduction, optimization, and verification of a hierarchical system design incorporating a timing model with obscured structural features therein. While in the past, a timing model with an operational timing characteristic thereof had been provided and integrated into a hierarchical circuit design, substantial problems remained with performing adequate timing analysis and other such associated tasks on the hierarchical system design incorporating the timing model. One illustrative timing verification step encountering problems with such abstracted timing model is a static timing analysis (STA). Aggravating the problem, timing analyses generally include a predetermined level of pessimism incorporated therein to ensure that the circuit design will not fail due to silicon, logic, or timing issues therein.

Such pessimism is added to the timing report of the circuit design to compensate for the obscured timing model and generally requires remedial changes to the design which leads to degraded power/performance/area (PPA) or lowering of the clock speed of the finished IC product to ensure proper functionality. Pessimism introduced during timing analysis of the circuit design greatly limits the ability of circuit designers to realize power efficiency, minimized area, and optimal performance at maximized operating frequencies. While the pessimism does guard against very serious silicon flaws, it tends to cause the embodied circuit design to be less than optimal. In a timing analysis, it is seen that the timing analyzer module will generally err on the side of conservatism or pessimism i.e. even finding a timing violation where one may not actually exist.

Once a circuit design has been placed and routed, the static timing analysis (STA) is generally executed upon the circuit design to determine timing violations according to an arrival time at a certain point across a signal path relative to a required time for the given signal at that point in the circuit design. Such required time constraint may be mandated implicitly, such as by necessary operation of sequential features of registers, flip-flops, and other sequentially operated elements. Another type of constraint defining required arrival times are the explicit definitions of constraints upon certain features of the circuit design. For example, a circuit designer may constrain the circuit design to ensure that, for example, a certain signal reaches a certain point within a certain time. If a timing violation does exist but is not caught due to the timing analyzer portion being too generous or optimistic, such missed violation may lead to a defective and non-functional IC product. For this reason, it is common practice to build in a certain amount of pessimism at each stage of the design, so that sufficient margin is allowed for even a worst-case signal arrival to fall within a range of acceptable times for the circuit design.

Therefore, following formal verification or sign-off, a large amount of pessimism has been aggregated throughout each step of the circuit design to generate a timing report for the circuit design cataloging the operational timing characteristics across a number of signal paths thereof. Therefore, it is standard in the industry following a timing analysis, or sign off, to reduce or remove, unnecessary pessimism without introducing optimism into the timing report to arrive at realistic timing characteristics.

A timing report generally lists a number of signal paths including a starting point and an ending point such as an input 1 to output 2 and the like. Each of the signal paths are defined by a beginning point and an ending point, generally having at least one operational timing characteristic described, such as arrival time, required time, and a slack time. Slack time generally reflects the required time minus the arrival time, and indicates whether a signal arrives on time, early, or late. In the case of a negative slack time where the required signal arrived at a time later than the required time, the signal path may be determined to be violating a timing constraint (either implicit or explicitly defined). While there may be a wide range of possible violations (for example, 10 to 10,000 or more detected timing violations) on a given circuit design, it may be seen that a certain number n of the possible timing violations may be due solely to an overly pessimistic analysis maintained by the timing analysis engine. Thus, some portion n of the great many timing violations possible may be safely removed by reducing or removing an amount of pessimism in those instances—though this runs the risk of introducing fatal flaws to the circuit design. A number of measures have been proposed for safely addressing this removal of pessimism in the timing report of the circuit design.

Some measures of cited include a common path pessimism removal (CPPR), execution of a follow-up analysis, an on-chip variation (OCV) execution, and a statistical timing analysis (SSTA), and the like.

As an example, On Chip Variation (OCV) generally attempts to account for physical variations in the embodied circuit design across a physical semiconductor substrate. Such irregularities may come about due to a varying dopant concentration, divergent NMOS and PMOS operational timing characteristics, localized temperature hot-spots, or voltage irregularities throughout the circuit design. In OCV, a single derating factor is used to remove pessimism and is applied in blanket-fashion. For example, a timing path having a specific arrival time of, for example, 1000 picoseconds may be reduced by a derating factor of 0.8 OCV to be attributed an arrival time of 800 picoseconds. If the 800 picoseconds (as opposed to the 1000 picoseconds) arrival time is found to not be violating the required time, then this signal path would be removed from the list of violating signal paths. As another example, a derating factor of 1.2 may be applied resulting in a 1200 picoseconds arrival time which incorporates 200 picoseconds of pessimism introduced by the derate factor of 1.2.

Generally, for each timing violation encountered, additional circuit elements must be added to the circuit design, removed, resized, exchanged for other stronger/weaker devices, or the clock frequency of the circuit design must be degraded to allow for proper operation of the circuit product. Such addition, resizing, and degradation of processing speed certainly affect the power, performance, and area characteristics of the circuit design.

Traditional sign-off and placement and routing (P&R) optimizer systems and methods are sub-optimal. The presence of detected timing violations conventionally resulted in an unacceptable amount of repeated iterative loops between the sign-off module and the optimization placement and routing module. Indeed, such looping may have taken days, hours, or weeks depending on the size of the circuit design and the number of timing violations determined therein. As circuit designs exceeding 200+ million instances are not uncommon, the problem is aggravated unceasingly. Worse yet, the fixing of a particular timing violation such as by adding a gate to remedy one timing violation, may introduce, for example, 100 or 1000 new timing violations which must each be iteratively addressed, themselves perhaps spawning 1000 new violations in a Hydra-like loop. In such manner, the signing off of a circuit design is often a very labor, time, capital, memory, and processing-resource intensive task.

Such deficiencies have heretofore hindered efforts to minimize fabricated integrated circuit product cost, time-to-market, power requirements, and substrate area, while maximizing performance.

There is therefore a need for a system and method for generation and use of a structurally-aware timing model of a circuit design while protecting the implementation details thereof from misappropriation.

SUMMARY OF THE INVENTION

It is an object of the present invention to provide a system and method for generating and using structurally-aware timing models in a timing analysis of a hierarchical circuit design and in post-processing pessimism removal from the timing report.

It is a further object to provide a structurally-aware timing model representative of operational timing characteristics and representative of a portion of the structural characteristics of the circuit design while obscuring the actual implementation details of the circuit design from a prospective customer.

It is yet a further object to empower a prospective client to use a representative timing model of a circuit design intellectual property (IP) to perform a number of verification or sign-off operations and optimization utilizing the model in concert with a client-designed top level or hierarchical mother circuit design without exposing implementation details of the model.

These and other objects are attained in the system and method for generation and use of a structurally-aware timing model.

A system for generating a structurally aware model for operation of a predetermined circuit design having at least one input terminal, at least one output terminal, and at least one component interconnected therebetween includes: a timing analysis unit executing to perform a timing analysis on the predetermined circuit design to generate a timing report. The timing report including a set of operational timing characteristics respectively corresponding to a set of terminal pairs in a predetermined circuit design. A selection unit is coupled to the timing analysis unit. The selection unit operates to select from each set of terminal pairs that belong to either a first or a second classification type. The first classification type includes one input terminal paired with one output terminal. The second type includes a pairing of either an input or output terminal paired with one intermediate terminal defined by a component of a memory type within the circuit design. A model generation unit is coupled to the timing analysis unit and the selection unit. The model generation unit executes to model an operational timing of the predetermined circuit design. The model generation unit generating a timing arc indicative of delay in signal traversal through a representative signal path selectively identified for each of the selected terminal pairs relative to a predetermined timing requirement. A structural characterization unit is coupled to the model generation unit. The structural characterization unit executes to selectively determine from the predetermined circuit design at least one preselected structural feature for each distinct signal path extending between each selected terminal pair. The structural characterization unit generates a structural weight indicative of the preselected structural feature for a representative one of the distinct signal paths selectively identified for each selected terminal pair. A hybrid model is thereby generated to include the timing arcs and the structural weights of selected terminal pairs, where each structural weight is associated with one of the timing arcs.

A method for generating a structurally aware timing model for operation of a predetermined circuit design having at least one input terminal, at least one output terminal, and at least one component interconnected therebetween includes: executing a timing analysis on the predetermined circuit design to generate a timing report including a set of operational timing characteristics respectively corresponding to a set of terminal pairs in the predetermined circuit design. Terminal pairs of a first or second classification type are selected from the set of terminal pairs where the first classification type pairs one said input terminal with one said output terminal. The second classification type pairs one of either an input or output terminal with one intermediate terminal defined by component of memory type within the circuit design. The operational timing of the predetermined circuit design is modeled to generate a timing arc indicative of delay in signal traversal through a representative signal path selectively identified for each of the selected terminal pairs, relative to a predetermined timing requirement. At least one preselected structural feature is selectively determined from the predetermined circuit design for each distinct signal path extending between each selected terminal pair. A structural weight indicative of the preselected structural feature is generated for a representative one of the distinct signal paths selectively identified for each selected terminal pair, wherein a hybrid model is generated to include the timing arcs and the structural weights of selected terminal pairs, each structural weight being associated with one of the timing arcs.

A method for using a structurally aware timing model for operation of a predetermined subordinate circuit design and a parent circuit design incorporating the timing model includes: establishing a parent circuit design defined by physical implementation data including at least a set of first paths, each path having a structural characteristic thereof. A timing model is established where the timing model is predefined to include a set of second paths therethrough with a respectively corresponding set of structural characteristics for each of the second paths through the subordinate circuit design. An hierarchical circuit design is established with guidance from a physical implementation data therefor. The hierarchical circuit design is formed by coupling the parent circuit design with the timing model of the subordinate circuit design. The first paths and the second paths of the respectively parent and subordinate circuit designs are selectively interconnected according to the hierarchical circuit physical implementation data to form a set of hierarchical paths. A timing analysis is then performed upon the hierarchical circuit design including the timing model of the subordinate circuit design to determine an operational timing characteristic for each of the hierarchical paths through the hierarchical circuit design. A preselected structural feature of each of the hierarchical paths are determined according to a corresponding structural characteristic of one of the first paths and a corresponding structural characteristic of one of the second paths. An advanced on chip variations (AOCV) derate function is applied to each of the operational timing characteristics for each of the hierarchical paths according to the corresponding structural characteristic thereof to reduce pessimism in the operational timing characteristic.

Additional aspects and details will be set forth in the description which follows and, in part, will be apparent from the description and Figures.

BRIEF DESCRIPTION OF THE DRAWINGS

FIG. 2 is an illustrative circuit design to be extracted into a timing model thereof;

FIG. 3 is an illustrative timing model generated in accordance with an exemplary embodiment of the present invention;

FIG. 4 is another illustrative circuit design operated upon and transformed in an exemplary embodiment of the present invention;

FIG. 5 is an illustrative extracted timing model shown as a library .lib file produced in accordance an exemplary embodiment of the present invention;

DETAILED DESCRIPTION OF THE PREFERRED EMBODIMENTS

Figure 1A:
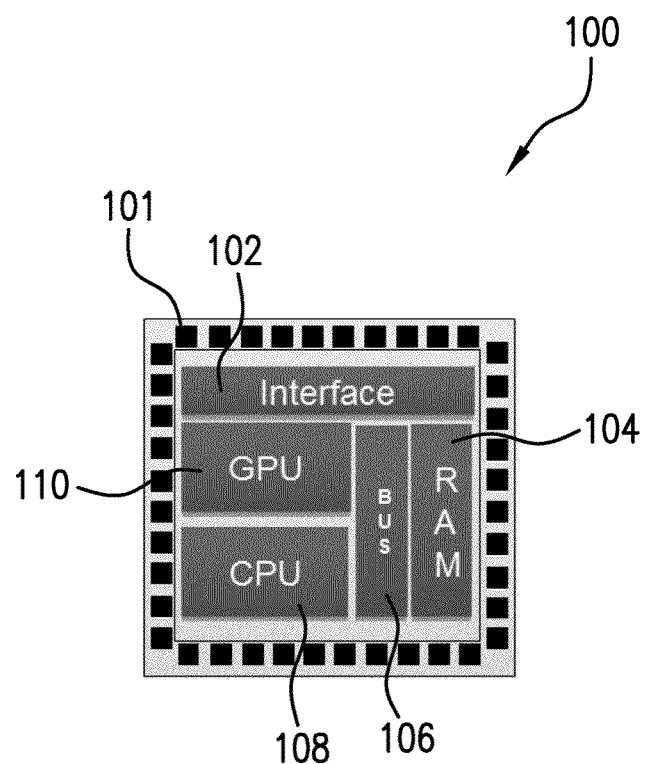
FIG. 1A is a simplified block diagram of an illustrative circuit design defined by physical implementation data representing a processor-based system on-chip (SOC) integrated circuit (IC) product incorporating a plurality of hierarchical functional blocks therein.

The subject system and method provide measures for generating and using structurally-aware timing models for operation of a predetermined functional block circuit design. The structurally-aware timing models are generated for incorporation into a top level of a hierarchical circuit design while obscuring implementation details of the block circuit design represented by the timing model. Although the top level is referred to herein for clarity, any the structurally-aware timing models may be incorporated into any level of a hierarchical design. A variety of timing and functional verification analyses on the hierarchical circuit design along with post-timing-analysis pessimism removal such as advanced on-chip variation (AOCV) based on a preselected structural feature of the circuit design represented by the timing model are additionally provided for.

Along an electronic design automation (EDA) flow, a circuit is conceived and elaborated through many computer-aided stages to arrive at a physical circuit design layout. The circuit design layout generally has actual coordinates and physical geometries defined for each component thereof and interconnections or signal paths therebetween for ultimate fabrication as an operable, tangible integrated circuit (IC) product.

An illustrative electronic design automation (EDA) flow traverses recursively through a plurality of stages towards the actual fabrication of complex integrated circuit devices, microchips, and systems. Device designs as complex as, for example, a system on chip (SOC) may include a plurality of processing cores, functional blocks, and other components arranged in a hierarchical manner. Such components may be sourced from a plurality of vendors or designers of intellectual property (IP). Such designs are extensively planned out, implemented, verified, and remedially modified/transformed iteratively and repetitively to ultimately arrive at a fabricated tangible physical device.

At first, an engineer or design team may have an idea or conception of a new circuit design, qualitative functionality or device. This idea is then mapped out into a logical schematic data defining a qualitative view of the functional goals of the device and interconnections amongst functional components thereof. Merely for example (though not shown), a first functional block may be connected to a second functional block which may be coupled to a character generator which may be coupled to a device display. At another level, a first output of an AND gate may be coupled to an OR gate, and at yet a smaller abstraction, two transistors may be, for example, serially coupled to represent an AND gate. A seemingly infinite number of different abstractions at different levels may be available to qualitatively capture the idea or conception of an ultimate device or goal.

A physical layout implementation stage builds upon such logical schematic abstraction of the data design to generate data specifying and representing how such logical schematic may be actually implemented physically. The physical layout is generated by placement and routing steps to include geometries and placement coordinates of components, such as gates, transistors, buffers, registers, flip-flops, and all manner of electrical integrated circuit structures along with routing interconnections or signal paths between these components. Such designs may require thousands of man-hours of work and processing time to arrive at an implemented IC product. Such designs may be colloquially referred to as intellectual property (IP).

Further data abstractions, such as a mask pattern, which is the ultimate or final step prior to fabrication of the physical device embodying the circuit design, may be included in the circuit design data as well. The totality of all the physical implementation data abstractions plus extrinsic data may collectively define the circuit design—though individual abstractions, such as the schematic or layout may be referred to herein as the circuit design, based on context, for clarity.

The finished circuit designs are generally referred to as IP and are guarded by a design house after having spent substantial amounts of time and money creating the IP. Were such IP to become publically available or shared with a competitor, then the designers of the IP would be unable to recoup the large expenditures in terms of time and money spent designing the IP. The contents of such IP tend to be closely guarded and not freely shared with customers, clients, competitors, or the public at large. Nonetheless, in an hierarchical design paradigm, functional blocks may be reused as part of another circuit design. For example, a specific component such as a graphics processing unit (GPU), a physics processor, a math co-processor, and the like may be incorporated hierarchically into a new circuit design rather than creating and implementing the same in the new circuit design.

While the IP of designers must be protected, enhanced measures for sharing of the IP and providing for verification and optimization must be afforded for meaningful use by those outside of the design house. Once functional blocks of IP have been incorporated into a new hierarchical circuit design, a placement and routing step which allocates placement of individual components on a semiconductor substrate such as silicon, germanium, or the like, is performed. Actual physical geometries and the physical coordinates are mapped reflecting how the circuit design will actually be fabricated on the silicon substrate by optical lithography or other such measures. The routing portion seeks to interconnect each of the individual components (on a plurality of levels such as a first transistor to second; AND gate to OR gate; weight generator to model extractor, and the like) to allow a signal or power to pass therethrough to define a signal path through a set of segments between nodes or terminals through the circuit design.

Following the physical layout generation, a number of verification checks and analyses are performed in what is generally referred to as a signoff stage, to ensure that the physical implementation of the logical design function as expected. In signoff, one such verification is a timing analysis (for example, static timing analysis (STA) or statistical static timing analysis (SSTA)). Such timing analyses perform operational or functional timing analyses on the circuit design. Generally, each and every path from each input to each output of the circuit design is exhaustively exercised. The exhaustive timing analysis exercises each and every path through the circuit regardless of whether it will actually be utilized during circuit operation.

Throughout the analysis of the circuit design, a set of required times are generally determined based in part upon user-specified explicit constraints and implicit constraints such as required by sequential order of elements. Some sequential elements may be memory elements which may include flip-flops, registers, latches, and the like.

Generally in a given timing analysis, a clock timing signal or data signal is propagated from clock roots or inputs and moves rightwards, or downstream through the circuit design. The signal propagates through each and every connected path segment of the corresponding clock network in the static timing analysis, arriving at each node at a certain time after departure from the clock route. Each of the arrival times of the signal at each node, amongst other characteristics, are measured and recorded to determine a delay at each node throughout the circuit design.

The arrival time at each node of the signal is compared against a required time as determined by the explicit definitions of constraint timing and implied constraints. To ensure that all timing is met and that the chip operationally performs in the timing domain such that the data arrives when required, a certain amount of pessimism, conservatism, or over-estimation, is included in the static timing analysis. Otherwise, if a timing analysis is overly optimistic, then proceeding further through the actual physical fabrication of the circuit design based on optimistic numbers, the chip may fail to perform in the manner expected, resulting in obvious consequences. STA is inherently designed to incorporate a pessimistic approach to ensure that at each level of the design, a worst operating case or range is anticipated and accounted for. A circuit design is not a static element, but operates through a range of changing operating conditions such as temperature, voltage, and process variations in the underlying substrate or physical embodiment of the circuit design. Pessimism thereby aggregates throughout each level and each analysis of the circuit design.

Each node or terminal throughout the circuit design that has an actual arrival time of the signal which is later than the required time of that signal at that node is considered to have a negative slack time. Slack time is the amount of tolerance, additional margin, or cushion where a signal can be modified to arrive later and still meet the required time. A negative slack time indicates that the signal arrives after the required time; thus, a timing violation is said to exist at every negative slack determined at the nodes of the circuit design.

Each timing violation in the circuit design must, generally, be remedied by appropriate fix of the circuit design before it is actually fabricated into an integrated circuit (IC) product. If a timing violation is not remedied before fabrication, the IC product may fail to operate as required. Thus, each timing violation determined through timing analysis in the circuit design requires a corrective action to transform the circuit design such that violations are remedied. Such remedial action generally includes adding additional logical gates, removing gates, resizing such gates, or the like, to either reduce or increase delay across a gate or signal path. If no suitable solutions or fixes may be employed, in some cases, the maximum operational frequency of the chip may be reduced. For example, a timing violation may be found to exist at a 2 GHz clock speed for the IC product; however, reducing the speed to 1 GHz, albeit at the loss of substantial processing power, may alleviate or remove the timing violation and allow for a functional product.

When fixing a timing violation, through the addition of a gate or transformation of the circuit design, for example, such fixing could itself potentially cause an exponential explosion of additional problems or violations as a result. This in turn would require further fixing, further corrective action, and further verification through measures discussed above such as for example, static timing analysis and the like.

This process loop of analyzing, fixing, verifying, refixing, and reverifying of the circuit design is a repetitive and costly process best avoided or minimized. Even where ample time and resources were available to tolerate the resulting inefficiencies, such process loop tends to yield sub-optimal finished IC products. For example, each added gate incurs an additional power drain, adversely impacting the circuit's power efficiency. Further, the addition of such gates increases die size of the finished product, meaning that the yield of products from a given wafer of silicon may be substantially reduced and devices incorporating the IC product must be bigger. Moreover, the fixing loop generally results in IC products of higher power drain, slower operational frequencies, larger circuit footprint, increased cost, decreased yield, and delayed or more expensive fabrication. Therefore, a preferred approach is to remove pessimism while ensuring no excessive optimism is added to thereby realistically analyze circuit design timing and avoid mis-identification of timing violations.

A significant portion of the pessimism introduced into a timing report may be attributed to additional pessimism built in to address variations in the chip due to such implementation factors as the particular manufacturing process used, varying dopant levels, divergent NMOS and PMOS timing characteristics, varying channel widths, and the like. It is seen that in actual practice, when a circuit design is fabricated in a semiconductor substrate, it is not a perfectly uniform substrate or resultant IC product. Therefore, a certain portion of the circuit design may have physical characteristics or operating characteristics which differ markedly from another given portion of the circuit design as implemented in the IC product. For example, in operation, the IC product may have hot spots forming due to increased current flow or other such issues. Therefore, signal paths traversing through the hot spots may exhibit different operational characteristics from those traversing non hot-spot portions of the circuit design.

Hot-spots are but one example of the different types of variation encountered in chip designs which produce different operational characteristics. In the past, to ensure that such variations in the circuit design are properly accounted for, a given delay or slack time would be multiplied by a factor representative of the likelihood of variation. For example, a chip design may have a blanket on chip variation (OCV) factor of, for example, 1.2 applied to at least one of the timing characteristics (either arrival time, required time, slack time, or the like). Such factor application thereby either increases the arrival time or decreases the required time to trigger more detected timing violations to be addressed to ensure that the circuit design operates as required. This particular type of pessimism due to the variations on the chip (both structurally and operationally) may be safely removed by more granular application of factors based upon the local variations therein.

Advanced on chip variation (AOCV) allows a derating factor to be applied to specific signal paths throughout the circuit design based upon a structural characteristic determined in that signal path. For example, the shorter signal paths (measured perhaps in distance such as micrometers or microns, stage counts, or as a function of transistor counts, or the like) are more likely to be affected by localized disturbances. On the other hand, in a longer signal path (for example, one with a higher stage count, transistor count, or etch distance), the localized disturbances or variations in the chip are less likely to affect the overall output of the signal path, and the impact of one local variation has a lesser impact on the overall aggregated signal path operational characteristics. In AOCV, a derate table in its simplest form, is a one-dimensional table based on, for example, stage count and having a corresponding derating factor which is selectively applied to each signal path dependent upon a structural characteristic thereof.

Design houses have competing interests in not wanting to expose their IP and circuit designs yet needing to enable clients to incorporate the design and perform certain manipulations and optimizations such as AOCV and the like that require internal implementation details. Simply obfuscating the internal implementation details of circuit designs is problematic for such incorporation as the implementation details are not available for subsequent optimization processes. Pessimism removal and the operational verification of the circuit design in toto including the functional block IP cannot be fully performed, and optimized. Such limitation may be addressed in part in the hierarchical design paradigm by signing off and verifying with pessimism removed therefrom in the design house. However, when the IP is integrated into an over-arching or hierarchical top level of a new circuit design, this creates an unknown in the over-arching sign off and optimization of the top-level circuit design incorporating the IP.

Such problems with the sign-off and optimization of an over-arching top-level circuit design are aggravated with the inclusion of perhaps a plurality of different IP functional blocks from a plurality of different design vendors. If the example of FIG. 1A hierarchical design 100 is considered, each of the functional blocks 102-110 may be supplied by a different design house. In the early stages of sign-off and optimization, the details of each of the functional blocks 102-110 may be obscured and the only structural characteristics that the integrating producer of the overall design 100 may have access to are their own top level interconnects ending immediately after an interconnection is made with an obscured functional block 102-110.

In the illustrative hierarchical circuit design shown in FIG. 1A, a simplified graphical representation 100 of the circuit design is shown to include a plurality of functional units 102-110. An interface block 102 is coupled to a terminal 101. A graphical processing unit (GPU) 110, central processing unit (CPU) 108, bus member 106, and a memory such as a random access memory (RAM) 104 are included. Each of the individual components 102-110 may be individual functional blocks or may be represented by intellectual property (IP) licensed from a design house. As such, in the early stages of the design, the actual implementation of each functional block 102-110 may not be fully divulged to an integrating client. For example, if an integrating customer or a manufacturer of a system on chip 100 were to outsource or license the functional block IP such as GPU 110 from an outside provider, the GPU 110 would not be implemented directly within the customer. To avoid the integrating customer having full access to the implementation details of the functional block IP GPU 110, the design house may obscure the structural details of the functional block GPU 110 and may instead provide merely a model divorced from the structural implementation details therefore.

The model may be a timing model where a plurality of timing arcs represent paths of the circuit design but without the actual gate elements defined therein. Instead, a blank path/arc such as from a terminal 1 to a terminal 2 with an associated timing value (determined during a timing analysis of the timing block internal to the design house) is provided. Such timing model is generally referred to as an extracted timing model (ETM) which is extracted based on a predetermined process, voltage, and temperature (PVT) corner for inspected operating conditions. Thus, a plurality of ETMs may be provided to a prospective integrating customer to evaluate different locations, placements, and timing operational characteristics of the functional block in the integrated hierarchical design 100. In such manner, the design house IP is protected and yet able to share certain details of the functional block without concerns of any misappropriation of trade secrets, proprietary knowledge, or the like within a given IP design.

Figure 1B:
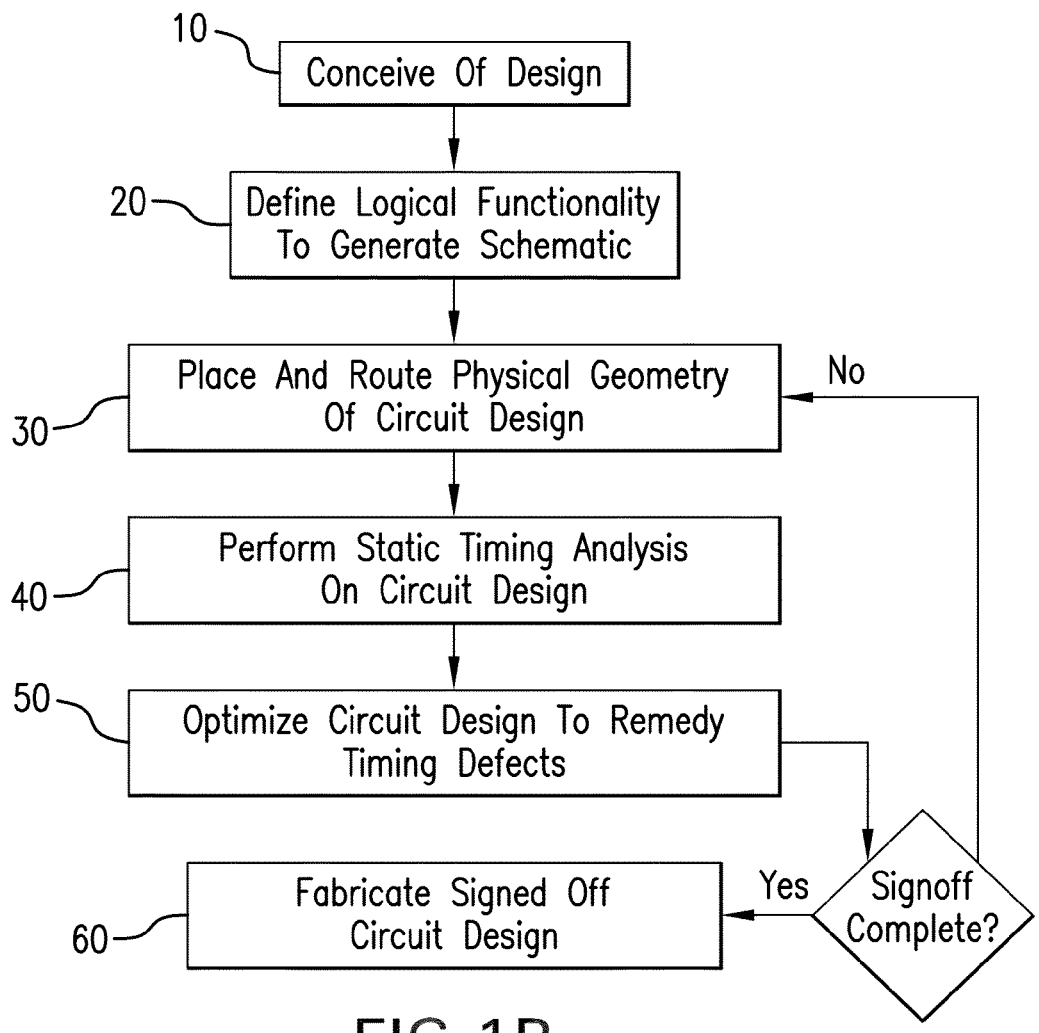
FIG. 1B is a flow diagram illustrating an electronic design automation (EDA) design flow beginning with a conceived design and culminating in a physical, tangible, operable fabricated IC product.

FIG. 1*b* shows a simplified illustrative design flow of an EDA process. Such process may be applied recursively and at a plurality of different levels. For example, the EDA flow may be utilized to produce a functional block as discussed above and may also be employed to produce a fully integrated hierarchical design such as a system on chip (SOC). A design is conceived at block 10 where a certain number of qualitative goals may be enumerated. At block 20, the conception of the design may be elaborated upon to define a logical schematic which lays out the functionality and a relative placement of components, though not yet in an absolute coordinate-based arrangement. In the logical stage, a component may be defined as connected to another component, although the particular path therebetween is not explicitly defined. Moreover, while a certain type of genus of component may be defined at a logical schematic generally, the actual part number or specific particular component may not be yet defined.

At block 30, the layout which generally defines the physical absolute conditions and particular components along with a particularized signal path and the route thereof stretching between a first component and a second component are generally defined. Following the generation of the layout, a number of verification analyses are performed at block 40, such as a timing analysis which may include a static timing analysis (STA) on the circuit design. In such manner, the layout of the circuit design (perhaps with a netlist data, constraint data, and other types of circuit design data collectively defining the circuit design) may be extensively tested to verify proper functionality thereof. Any timing violations detected in the circuit design are passed to the optimizer portion at block 50 where timing violations are generally remedied, such as by the addition, subtraction, or resizing of circuit elements. Following the optimizing remediation portion at block 50, it is determined whether sign-off is complete, and if yes, further steps are taken to fabricate the signed off circuit design at block 60. If, however, the optimization has not remedied all violations, then the circuit design is passed back to be further placed and routed, and modified according to constraints and the timing violations therein. Following the modifications to the circuit design, sign off is again attempted. If the design has been successfully signed off and found to not contain any timing violations or other functional or operational problems, then the circuit design is passed off to fabrication to fabricate a tangible physical integrated circuit (IC) product.

Figure 1C:
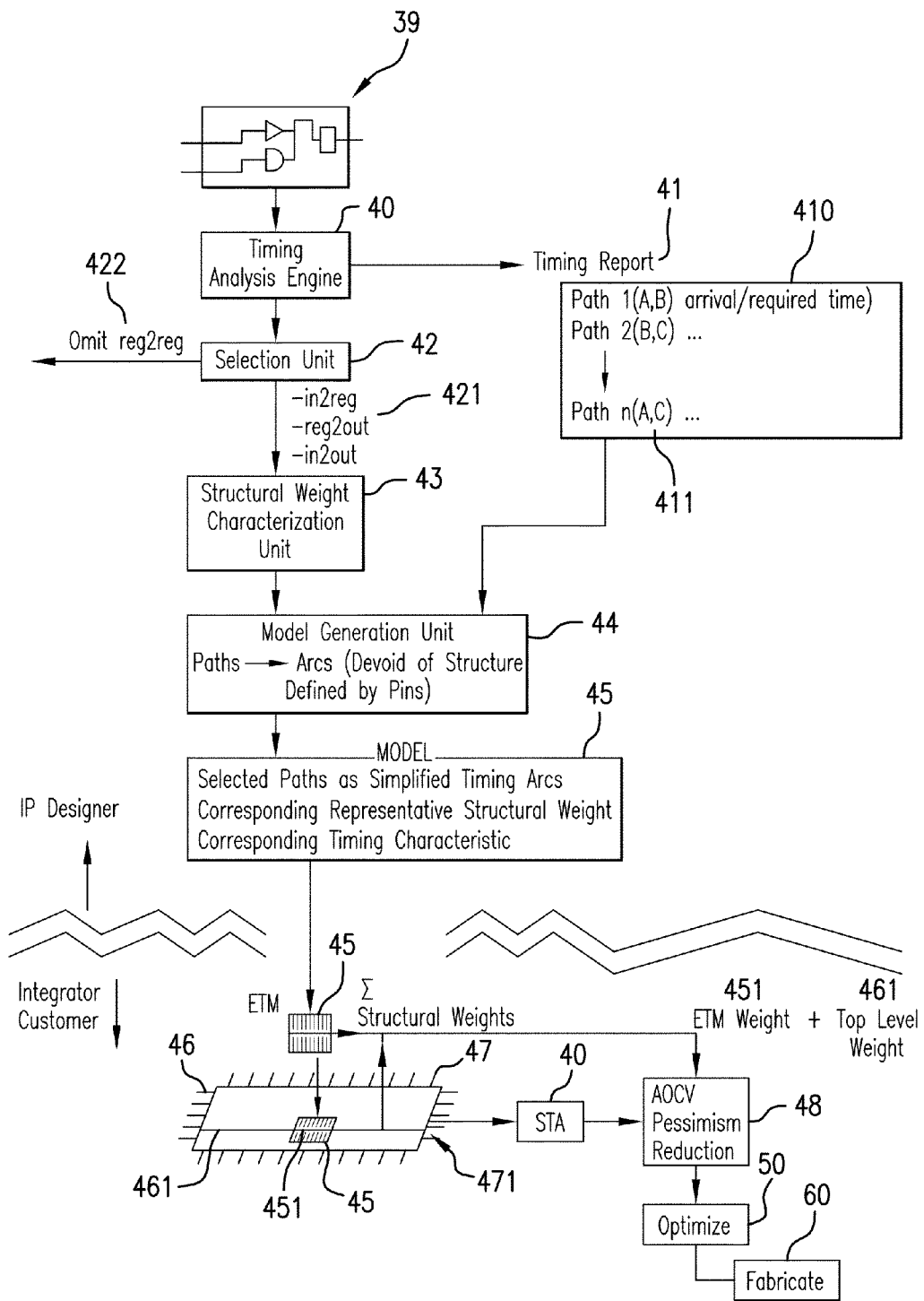
FIG. 1C is a more detailed flow diagram illustrating a flow of timing model generation for integration in a hierarchical circuit design with subsequent sign off and AOCV based pessimism removal.

FIG. 1C shows an illustrative simplified EDA flow for generation of a timing model of a functional block along with the provision of the model to an integrating customer where verification and pessimism reduction to optimize the circuit design will be performed. Circuit design data 39 such as a net list and other pieces of circuit design data collectively defining the circuit design are provided. Such circuit design data 39 provides input to a timing analysis engine, such as a static timing analysis engine 40. The timing analysis engine 40 executes to perform suitable timing analyses on the design data 39 and generate a timing report 41. A simplified version of a timing report 41 is illustrated where the contents 410 list a plurality of signal paths through the circuit design correlating a start point such as A and end point such as B with both an arrival time and a required time. When the arrival time is subtracted from the required time, a slack time is defined. Negative slack times generally represent timing violations which need to be addressed before fabricating the circuit design. Illustrative paths 1, 2, . . . n are shown and include a correlation between a start point A and end point C as seen at 411. The timing report 41 is eventually provided to the extraction or model generation unit 44.

The circuit design data 39 is then provided to a selection unit 42 to select a plurality of terminal pairs or signal paths through the circuit design for representation in the model extracted by the generation unit 44. In this exemplary embodiment, paths from a first register to a second register, also known as an internal logic, are omitted as indicated by arrow 422. A remaining subset of the paths or terminal pairs/sets include: 1) an input port or pin to a register or to the internal memory, 2) a signal path from a register to an output port or to a pin, and 3) an input pin to an output pin are shown at 421. The selected paths will then be identified or sent to a structural weight characterization unit 43. Such passing of the selected paths may be through the marking of a net list with tag or marker data, copying the relevant pairs/sets or paths into a new intermediate file, or any other means or measures of passing or indicating which signal paths or terminal pairs/sets are to be evaluated. Indeed, any suitable measures known in the art may be used in this regard.

The structural weight characterization unit 43 evaluates each of the plurality of selected paths 421 from selection unit 42. The structural weight characterization unit operates to determine a representative or characteristic structural weight for a preselected structural feature of each of the paths or terminal pairs/sets in the circuit design. In any given selected path such as from an input port to a register, there may be a plurality of signal paths traversing in distinct fashion from the first terminal to the second terminal. The structural weight characterization unit may evaluate the preselected structural feature of each of those distinct signal paths and arrive at a value characteristic of the entire set. For example, a stage count (meaning a number of components and their associated input and output interconnects) is preferably evaluated. If each signal path between each selected terminal pair/set is evaluated based upon the stage count thereof, the structural weight characterization unit may arrive at a characteristic weight for each terminal pair defined by, for example, performing a worst case analysis on the plurality of signal paths. Alternatively, an average mean, median, mode, or any known measure for finding a characteristic weight as would be known to one of skill in the art may be employed. In the event that a worst case stage count is used, at least a portion of the pessimism is preserved which may be safer (in terms of arriving at a functional IC device) than employing a best-case analysis which may inadvertently allow some optimism into the circuit design. As discussed above, optimism is to be avoided as it may result in operational failure; however, some balance may be achieved weighing the pessimistic results with optimistic results. It is important to note that the stage count is merely an illustrative structural feature to be characterized. Alternatively, the distance of a signal path, such as in micrometers or any other unit of measure may be employed. Another illustrative structural feature to be characterized may include a number of transistors in each component of the signal path.

Any one of such individual structural features including distance, stage count, or a function based on transistor count may be employed to determine the structural feature of the subordinate circuit design 39 for characterization thereof. Further, any suitable combination of the structural characteristic features may be considered with any number of analyses, such as best case, worst case, averaging, and the like. By characterizing a plurality of different structural features amongst a plurality of different signal paths extending between any given terminal pair or set, the extracted timing model is beneficially reduced substantially in size, thereby mitigating runaway memory and processing requirements which tend to increase in the EDA process flow. The structural weight characterization unit 43 may output a file such as a database maintaining the listing of selected terminal pairs or signal paths with a corresponding characterized structural weight thereof.

An illustrative model 45, having been generated by the model generation unit 44 includes the selected paths or terminal sets as simplified timing arcs devoid of structure and maintaining merely a correlation with an operational timing characteristic thereof. The operational timing characteristic of the timing arc may be any of a late arrival, early arrival, range, average, median, mode, and the like, as would be known to one of skill in the art. Additionally, a corresponding representative structural weight of the terminal pair or signal path represented as a timing arc is provided as well. In addition, the model preserves certain clocks that are asserted inside the block in the form of generated_clock construct.

Typically, steps 39-44 are performed internal to a design house to maintain the proprietary nature of the IP embodied in the circuit design implementation details. A design house may then share the model 45 as a preliminary measure for allowing potential customers or clients to evaluate the model incorporated into their higher level hierarchical circuit design. For example, model 45 may represent a graphical processing unit (GPU), CPU, physics co-processor, or the like. Such model 45 may be taken by an integrating client and coupled with a parent top level design 46 such as a system on-chip (SOC) to determine a compatibility thereof and whether it meets certain design rules. The hybrid model 45 is coupled to the top level design 46 to form an hierarchical design 47. Once the model 45 is incorporated into the top level 46, a plurality of hierarchical signal paths 471 extend across the top model portion 461 and the timing model 451.

In such incorporation of the model 45 into a top-level design 46, a certain amount of unknowns exist about the model 45 such as the structural implementation details thereof. Subsequent optimization, verification, and remediation steps generally ideally perform with an unlimited structural knowledge of the entirety of the hierarchical design 47 including the structural knowledge of the model 45. However, due to fear of unfair competition and misappropriate of the implementation details of the model 45, this structural implementation data is generally not shared with the integrator or customer.

Thus, when the hierarchical design 47 is passed on for timing verification 40, the model will generally pass along a representative timing characteristic thereof which may not be as accurate or comprehensive as the design itself, but is at least a suitable approximation of the timing characteristic one would expect. The timing characteristic of the top level portion 461 may be computed in coordination with the portion 451 of the timing model 45. Thereby the timing analysis engine 40 may exercise upon signal paths 471 having a portion of the path 451 extending across the model 45 without causing undue errors or difficulties. Once the timing analysis and other verification analyses are performed in block 40, the timing report of the hierarchical design 47 including the model 45 are passed to a pessimism reduction portion 48. The AOCV pessimism reduction model 48 may take the structural characteristics of the top level 46 with structural characteristic of the timing model on a path by path or terminal pair basis to consider the two structural weights in combination. With structural knowledge or at least representative structural knowledge of the timing model 45, the pessimism reduction engine may operate to reduce pessimism in the circuit design and remove misdiagnosed timing violations.

As discussed above, any savings in timing violations and in the iterative repetitive looping between optimization, verification, and remediation in the aggregate, greatly improve time to market, and certain power performance area (PPA) aspects of the fabricated circuit design. Once the timing violations due to AOCV have been removed and any other varieties of pessimism removal such as CPPR and the like are performed, the circuit design is passed on to the optimizer 50 to remediate extant timing violations remaining therein. Following optimization, if all violations have been corrected and no constraint violations remain, then the circuit design is passed on to fabrication step 60 for ultimate fabrication.

Figure 1D:
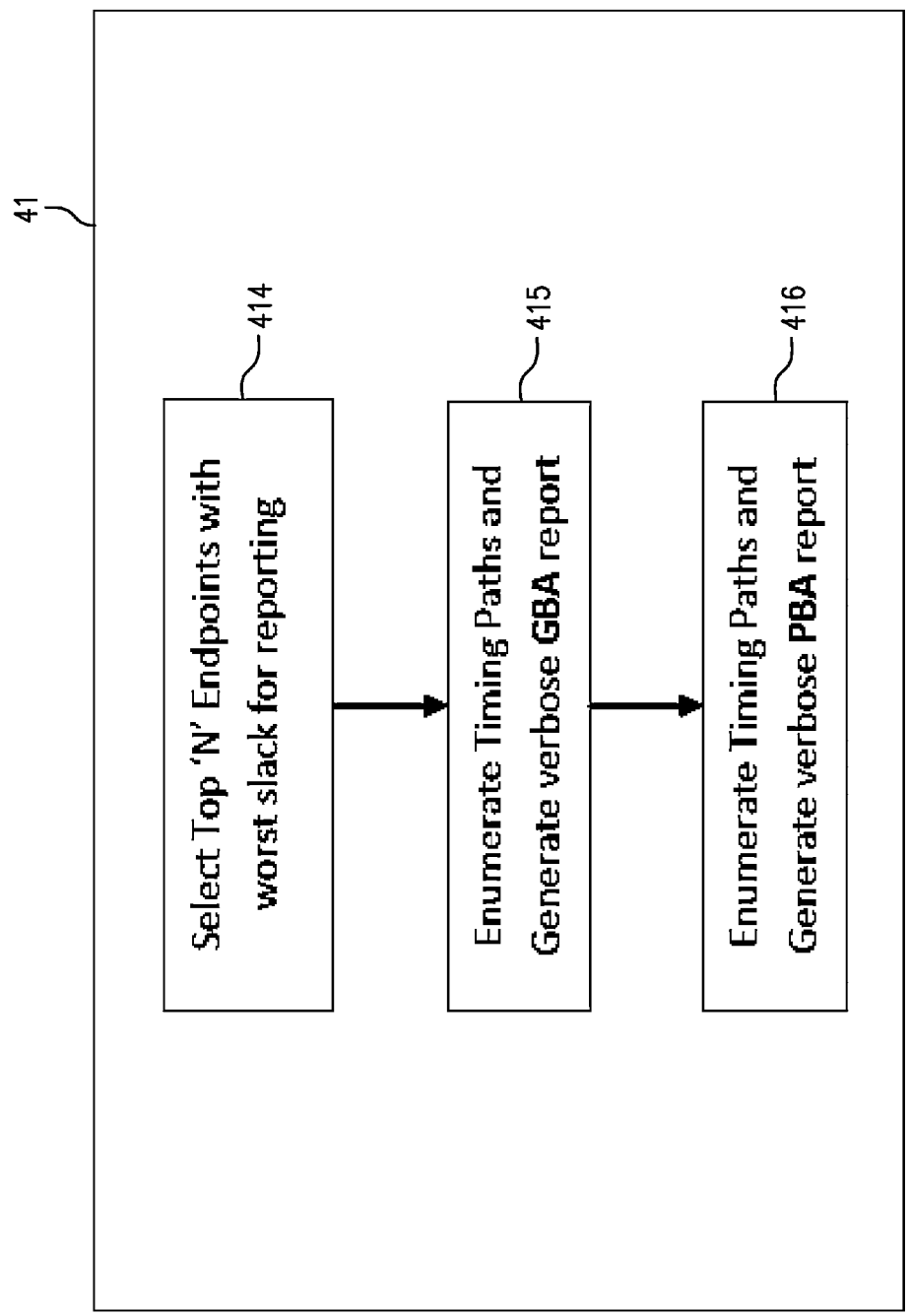
FIG. 1D is a yet more detailed flow diagram illustrating an EDA flow, subsequent to a static timing analysis, for generating a timing report.

As seen in FIG. 1D, the timing report generation 41 allows for a plurality of different options for timing reports. Generally, the most critical endpoints with the worst negative slack are reported at block 414. The worst slack may result from a ranking or sorting of slack times resulting from arrival consideration relative to a required arrival time consideration. As there are many different timing analyses such as STA, SSTA, or the like, there are also different configuration options/employed modules of static timing analysis including a graph-based analysis (GBA) or a path-based analysis (PBA). At block 415, the timing paths are enumerated to generate a verbose graph-based analysis (GBA) report 415. Additionally, at block 416, the timing paths are enumerated and a verbose PBA report is generated. These reports generally contain a plurality of different operational timing characteristics of the circuit design, and are used to locate and isolate violations in the circuit design for subsequent remediation and optimization thereof.

FIG. 2 shows an illustrative circuit design with a plurality of input and output terminals 201, 205, 209, 203, 207, and 211. A plurality of components are seen such as inverter 241 and register or flip-flop 240. A first signal path 202 is defined through the circuit design 200 to pass from an input port 201 to an output port 203. In the traversal, the input to output port signal path passes through component 241 which, in this example, is an inverting buffer, and an additional inverting buffer (not numbered). The path 202 has, for example, a stage count of two, from terminal pair 201, 203. Path 202 is represented as a timing arc 202' in FIG. 3. The corresponding timing arc 202', represents this one path 202 or may represent a plurality of paths between input 201/201' and output 203/203'. Path 202 has a plurality of operational and structural characteristics 242 corresponding therewith. For example, a stage weight of 2, a distance of 200 micrometers, a transistor count of 4, a timing delay of 100, a required arrival of 110, a slack of 10, and the like, are recorded and correlated with each path identifier such as arc 202'.

Another illustrative signal path 219 stretches between input1 205 and a data terminal for a register 240. Signal path 219 in FIG. 2 is represented as a timing arc 219' in FIG. 3.

Timing arc 219' similarly has a number of functional and structural characteristics associated with it including a stage count of 1, potentially a distance of, for example, 50 micrometers, a transistor count of 1, a certain delay, required constrained times, and the like. In some instances, path 219 may be analyzed and represented by a timing arc in isolation. In other instances, the path 219 is analyzed and represented collectively with a path 229 originating at a clock input port 209 and passing through an intermediate terminal 227 coupled to the same register 240 from which signal path 219 terminates at a data input point 217. Additionally, an implied path between the data pin 217 and the clock pin 227 is shown as a dotted line signal path 228. Timing arc 219' thereby represents the collective sum of paths 219, 228, and 229. This is known as a set-up/hold timing arc and models the amount of time it takes for the clock signal to reach a point co-terminus with the data input signal at 217. This is also regarded as an input to register path.

One signal path that is not represented in the timing model is the path 225 having an inverter and spanning from terminal pin 221 to 223. This is a register to register path. This path is known as the internal logic and is not affected by connection to an external hierarchical circuit. Therefore, the top-level circuit couples with the timing model but only affects paths between input and output, input to register, and register to output. The register to register paths are omitted herein as having no affect on either the timing verification or the pessimism removal therefrom. Timing arc 233' represents a path starting at the input port 201 traversing past the inverting buffer element 241 following signal path 233 through a buffer on signal path 225 to an input terminal 223. Additionally, a clock signal following path 229 then signal path 237 to arrive at a clock terminal 230 of the second register element to then transit through the register element along path 231 to arrive at the data terminal 223. Such path is another example of a set-up/hold check and represents an input to register meeting with a clock to register path thereof.

The register to output path 215 connecting an output terminal 213 of a register to an output1 207 of the circuit design is represented as a timing arc 237 connecting the clock 209' of the model to an output1 port 207'. This is due to a clock signal propagating from an input port 209, through a segment 237, through a buffer, through a clock input port 230, traversing across the register to arrive at a register upper port 213, and then through segment 215 to the output1 port 207. Lastly, timing arc 235' represents the path 235 of the circuit design. This timing arc 235' models the signal path from the clock port 209 to an output 2 port 211. As with all of the timing arcs, timing arc 235' maintains independent correlated list of operational and structural features or characteristics representative of the path 235.

FIG. 4 is another representation of an illustrative circuit design including a signal path 202' from input to output with no intermediate registers therebetween. The terminal pair in and out are represented in a model timing report as seen in FIG. 5. The model timing report is merely an example but illustrates the correlation between a terminal pair, an operational timing characteristic and a structural characteristic, such as seen in the stage weight column including a first stage weight 202" and a second stage weight 202'''. This is due to a plurality of different types of timing conditions such as fall/fall, rise/rise, and the like.

Figure 6:
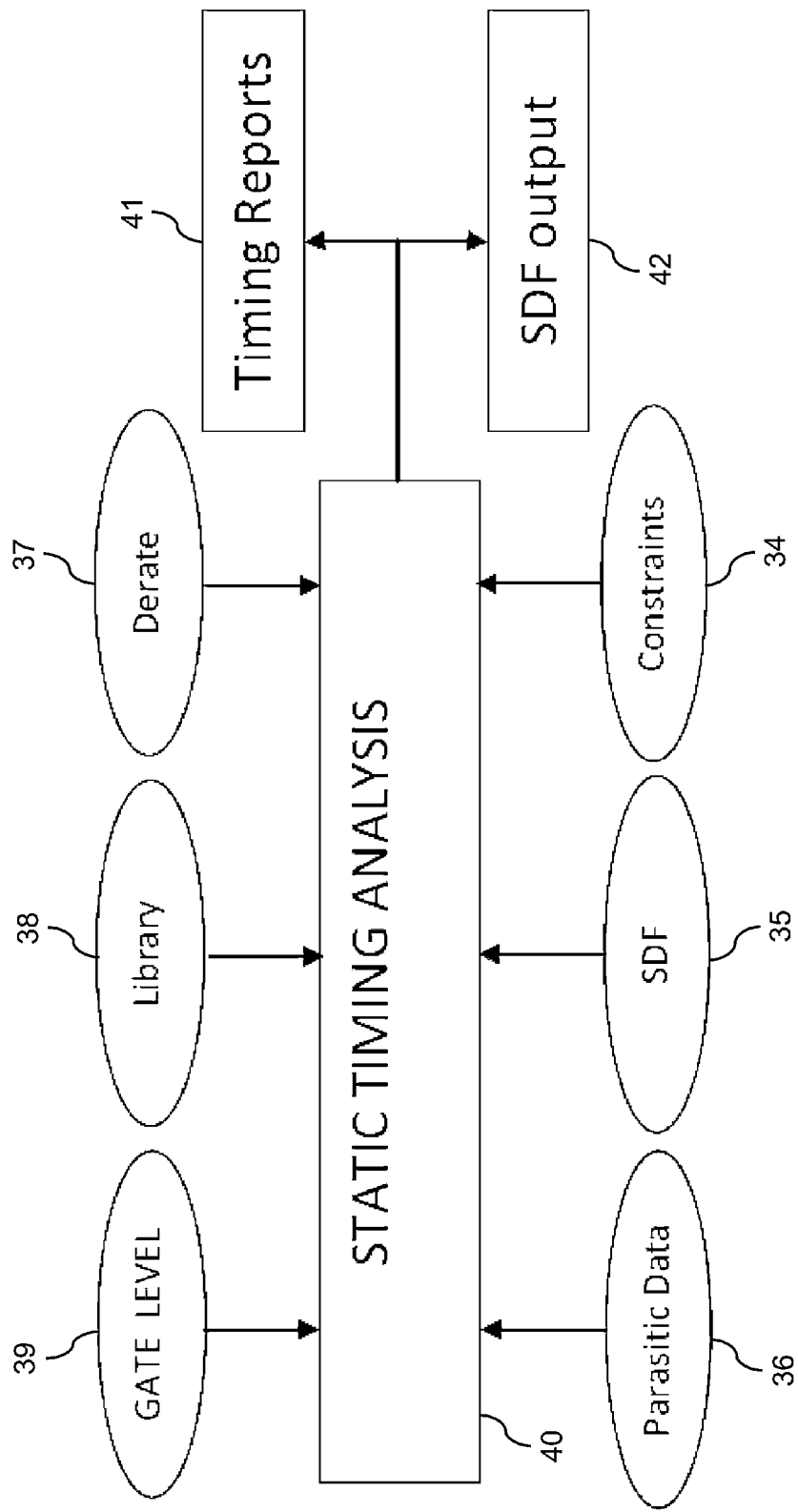
FIG. 6 is an illustrative flow diagram showing a plurality of inputs and outputs to a static timing analysis portion utilized in combination with several other elements in an exemplary embodiment of the present invention.

FIG. 6 shows a static timing analysis block 40 accepting a plurality of inputs including a gate level circuit physical implementation data 39 which may include for example, a net list data, layout data, or the like. A standard cell or AOCV LIB input 38 is provided as a library of standard delays across gate elements and the like. Derate input 37 provides information on a derating table applied to the circuit design as part of the AOCV pessimism reduction post-processing following the timing analysis. Parasitic data 36 is provided to model effectively the delay across interconnects between components in the circuit design. A standard delay format (SDF) is read in at block 35 to provide a predetermined time across gate elements without having to model or simulate those elements. A constraint file input 34 is provided. This may establish and determine constraints explicitly defined therein upon operation and time characteristics, as well as potentially structural characteristics of the circuit design.

The static timing analyzer at block 40 performs at least one static timing analysis on the circuit design data to determine a timing report thereof and any violations of the constraints. Upon successful completion of the static timing analysis, at least one timing report 41 such as the illustrative version seen in FIG. 5 is output. Additionally, standard delay format (SDF) 42 is output as well.

Figure 7:
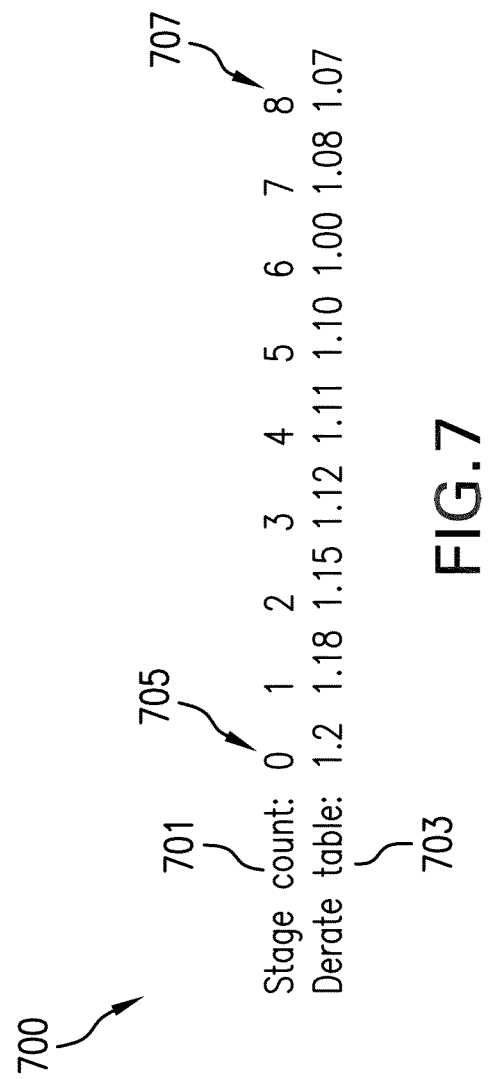
FIG. 7 is an illustrative highly simplified one dimensional derate table according solely to stage count.

FIG. 7 shows a highly simplified one-dimensional derate table 100 where the metric is stage count 701. The correlated derate table 703 is a plurality of derating factors to be applied in a path-by-path pessimism reduction post-processing of the timing report for the circuit design following the static timing analysis. In such manner, the shorter signal paths having a stage count of 0 such as seen at portion 705 of the Figure would correlate with a higher 1.2 derate factor to be applied to the timing values. Conversely, signal paths with a higher stage count such as 8 seen at portion 707 may be given a lower derate factor of, for example, 1.07. The derate factor e.g., 1.07 may be multiplied against an arrival time or a required time of the corresponding path of the circuit design.

Figure 8:
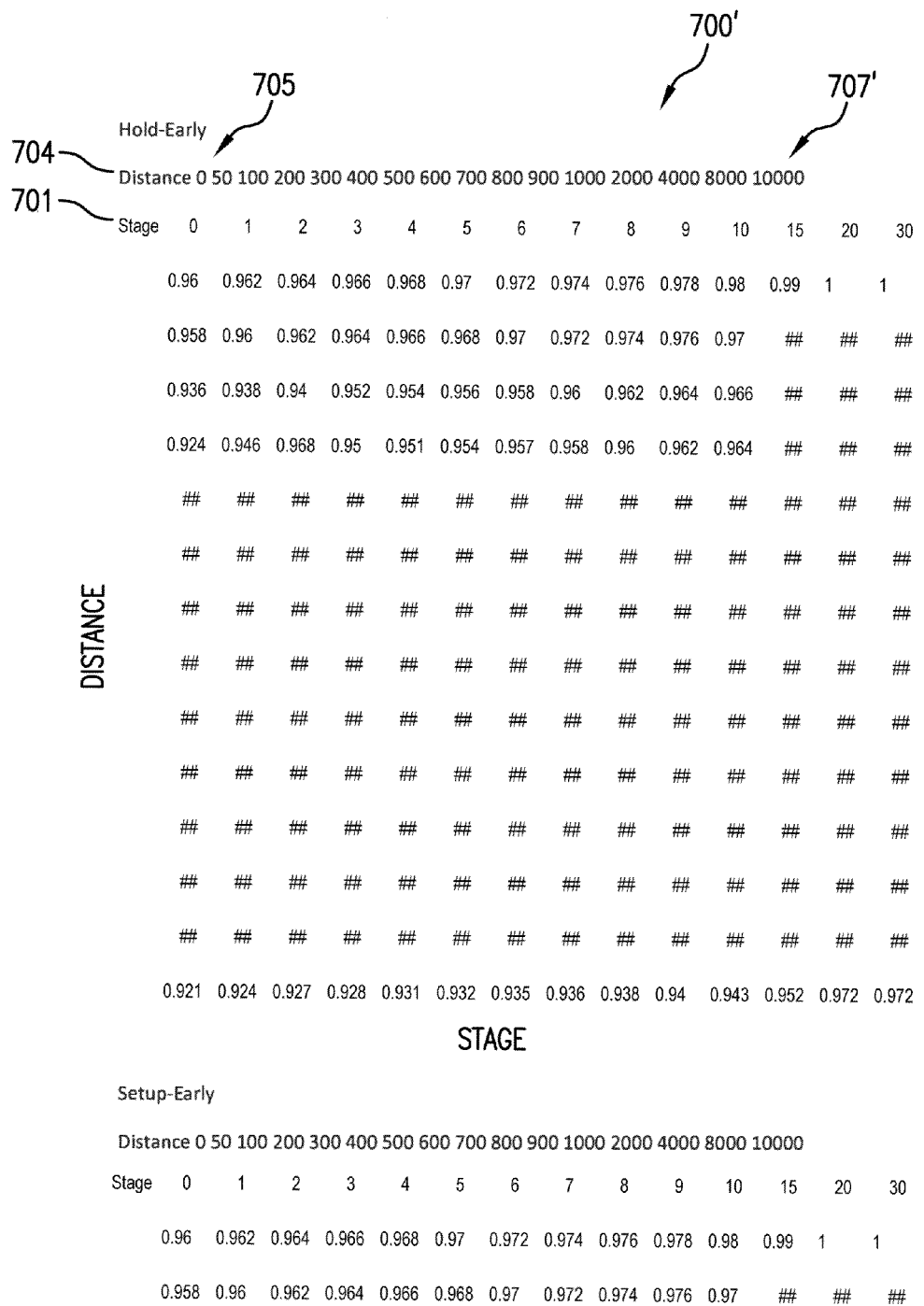
FIG. 8 is a more detailed illustrative derate table having two dimensions of structural features including signal path distance and stage count.

FIG. 8 shows an illustrative two-dimensional advanced on-chip variation (AOCV) derate table having a first dimension of distance 704 and a second dimension of stage count 701. The vertical dimension shows distance units while the horizontal dimension shows stage count. The portion 705 showing a distance of 0 and stage of 0 should result in the highest pessimism because this is the shortest stage count and shortest distance, therefore localized disturbances in the process, voltage, or temperature corner have the greatest impact over the signal path. Conversely, the portion of the table proximate 707' having the longest distance and the longest stage count correspondingly has the most pessimism. Local disturbances in the process, voltage, and temperature would have the least impact overall on the longest signal path as minor localized disturbances do not have a great cumulative effect on the overall path. It is important to note that the derating values applied herein are merely illustrative and may not be indicative of actual AOCV derate numbers used. The values are merely shown for clarity purposes.

Figure 9:
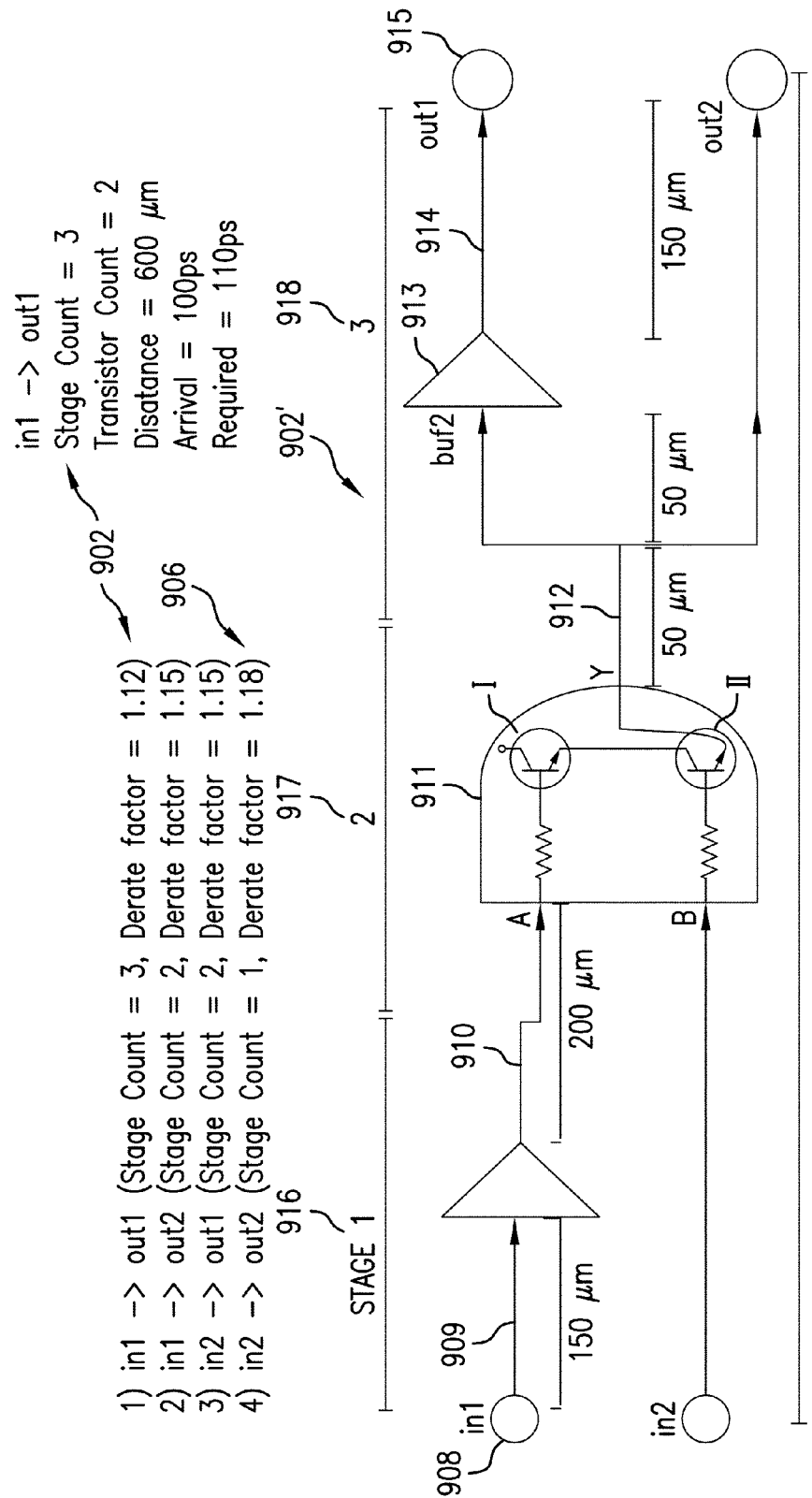
FIG. 9 is another illustrative circuit design showing a plurality of structural characteristics thereof including a corresponding derate factor for each signal path of the circuit design.

FIG. 9 shows another illustrative circuit design having a plurality of signal paths stretching between a plurality of terminal pairs. Each of the signal paths may have a plurality of structural characteristics and operational timing characteristics thereof. A terminal pair input 1 to output 1 is represented by a signal path 1 at block 902. Signal path 902 traverses from an input 1 port 908 across a first segment 909 having a merely illustrative distance of 150 micrometers (not to scale), passes through a buffering element BUF1 through a segment 910 having an associated structural characteristic of distance 200 micrometers to traverse a first stage, stage1 916. The signal traverses through an AND gate 911 having two transistors I and II disposed in series relation to exit at a section 912 having a summed physical dimensionality of 100 micrometers to arrive at a buffer 2 element BUF2 913. The signal then traverses through a section 914 to arrive in the output1 915 thereof. In this exemplary embodiment, the signal traversing from input1 port 908 to output1 port 915 traverses a total of three stages: stage1, 916; stage2, 917; and stage3, 918. Additionally, the signal 1 traverses a total of 600 micrometers and a total of two transistors. Thereby, signal path 902 may be represented in the timing model as a timing arc 902' having at least the terminal pair identified such as input1 port 908 and output1 port 915; a timing characteristic thereof and a representative characterization of at least one preselected structural weight thereof. The preselected structural weight may be a function of or based upon the distance, stage count, transistor count, or a combination, permutation, or mutation of the above. Indeed, any suitable structural characteristic of the signal path as would be known to one of skill in the art may be characterized for aiding in later AOCV or other pessimism reduction post-processing operations following timing analysis of the circuit design. The measurements herein are merely illustrative.

The signal path 906 extends between a terminal pair defined by input 2 and output 2 having a stage count of 1. When utilizing the stage count, distance, or a function of transistor count as an index in a derate lookup table such as seen in FIG. 7, the stage count of 1 would lead to the derate factor of 1.18. This illustrative derate factor 1.18 will be applied to accordingly reduce pessimism from the path thereof. If the stage count and distance are preselected as structural features to be utilized as indices in the AOCV derate, then a two-dimensional derate table such as seen in FIG. 8 is employed with double indices of distance and stage count. If all three of the illustrative structural features of the circuit design including transistor count, stage count, and distance of the signal path are utilized as a tuple, then a correspondingly generated three-dimensional derating table would be used for the AOCV pessimism reduction step. Such three-dimensional derate factor table has not been supplied herein for clarity and brevity purposes. If, instead of maintaining the features separately, a formula is used to arrive at a composite index based upon any combination of the structural weights, a single dimensional lookup table may be used responsive to the composite weight.

Figure 10:
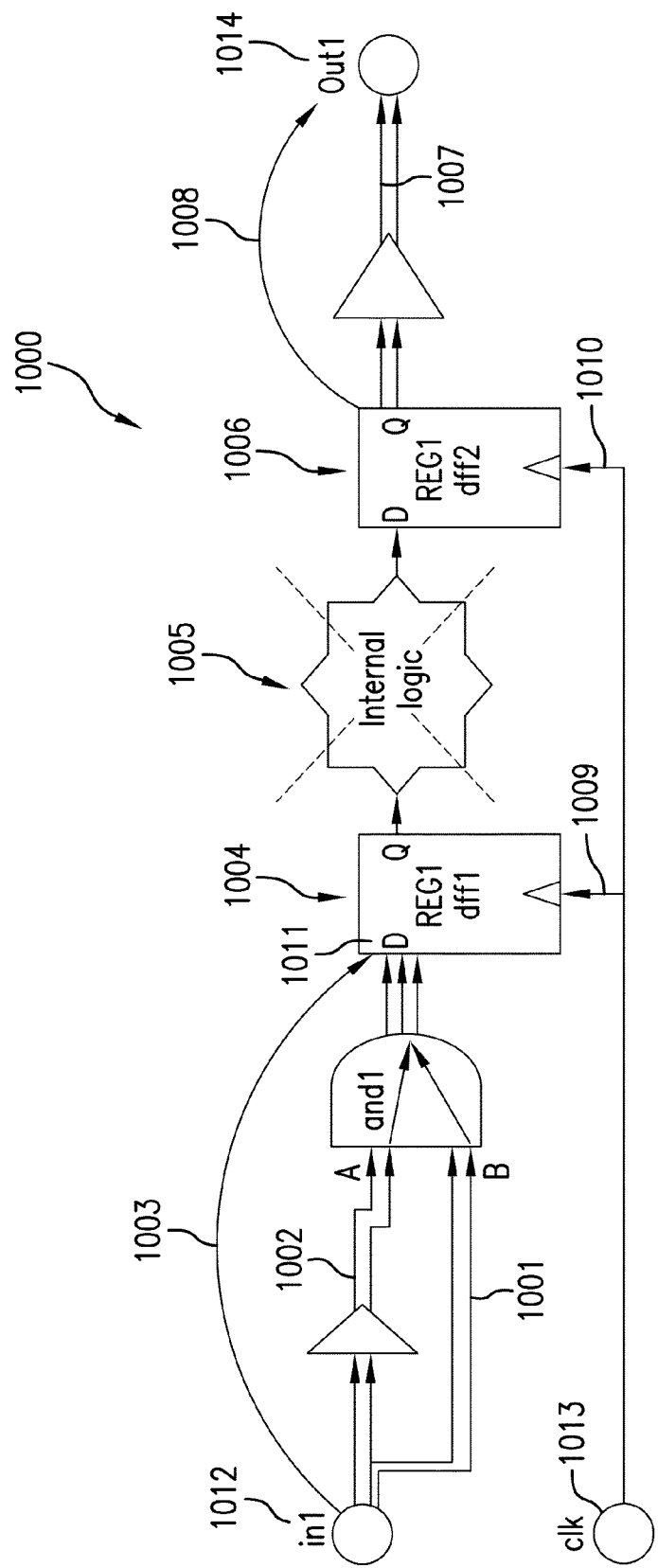
FIG. 10 illustrates yet another illustrative circuit design with a plurality of path portions and timing arcs representative thereof.

FIG. 10 shows a more involved illustrative circuit diagram where a plurality of signal paths, for example, signal path 1002 and 1001 exist between two given terminal pairs such as terminal pair: input1 port 1012 and the data pin 1011 of register 1 (REG1/dff1) 1004. The two signal paths 1002 and 1001 follow separate distinct paths and have different structural features such as stage count and potentially distance or transistor count. In a preferred embodiment, at least one preselected structural feature of each of the alternate signal paths 1002 and 1001 are weighed to arrive at a fair characterization of a structural weight to represent timing arc 1003. Timing arc 1003 will then be used to represent the input to register signal terminal set. In a preferred embodiment, each of the distinct candidate signal paths 1002 and 1001 are evaluated based on a stage count and a worst case stage count is taken to be the representative stage count for the structural weight of the timing arc 1003. In this instance, the first signal path 1002 has a stage count of 2 whereas the second signal path 1001 has a stage count of 1.

Signal path 1001 has the lowest stage count, perhaps the lowest distance and perhaps the lowest transistor count, therefore likely has the lowest index in each of the derate structural feature categories. It can be seen that the least pessimism will be removed which is the worst-case to ensure a functional circuit product. In certain computations, the structural feature of the path spanning from the clock input pin to clock generator or clock root 1013 to the clock input pin 1009, and its traversal across the register1 1004 to arrive at the data pin 1011 will be considered as well. In some exemplary embodiments, the data stage count (or other structural weight depending upon the selected structural feature/(s)) is maintained separately from a clock stage weight structural feature thereof preserved in the timing model and supplied to the timing analysis engine for consideration collectively with the top level of the hierarchical circuit design incorporating the model thereof.

In the simplified illustrative circuit design 1000, the internal logic portion 1005 includes an entire logic cloud stretching between a first register output port and a second serially disposed register input port. This internal logic 1005 is entirely excluded from the timing model. This is due to the fact that the incorporation with a top-level design to form a hierarchical design has no effect upon this internal logic 1005. Additionally, processing time and memory storage space requirements are reduced as less data is being used and less signal paths are being evaluated. Moreover, the exclusion of such paths furthers the goal of obfuscation of the implementation from prospective customers.

This illustrative circuit design 1000 does not have any input-to-output (IN2OUT) direct paths without intermediate registers. Therefore, no timing arcs of this type will be preserved in the model.

The last type of timing arc to be preserved in the timing model is timing arc 1008. Timing arc 1008 is a representative timing arc characterizing the signal path between an output port of a register2 1006 and an output port of the circuit design in tow 1014. This register-to-output (REG2OUT) path represented as timing arc 1008 is representative of the signal path 1007 and will have, in this illustrative instance, a stage count of 1. Additionally, the clock signal path stretching from a clock route 1013 through clock input pin 1010 of register 2 1006 passing therethrough and arriving at the output or Q port of the register may be considered and retained separately, or used in combination with the data stage count structural feature to more closely characterize and represent the signal path 1007.

Figure 11:
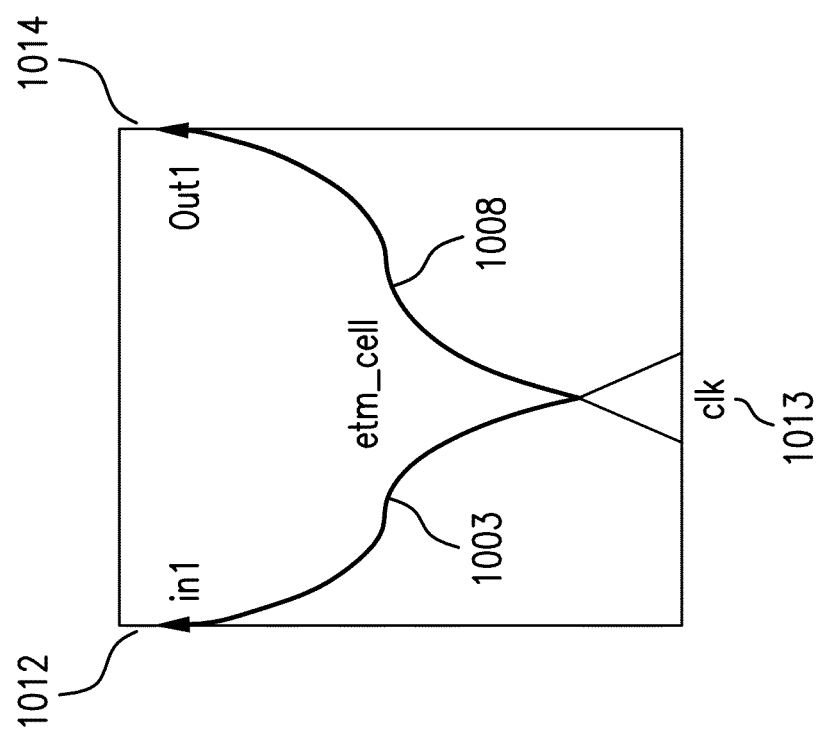
FIG. 11 is another illustrative timing model in accordance with an exemplary embodiment of the present invention.

FIG. 11 shows an illustrative timing model showing a plurality of timing arcs 1003 and 1008 set to correspond with the circuit design represented from FIG. 10. The clock route 1013 via timing arc 1003 to the input 1 port 1012 is represented as is the path from clock route 1013 via timing arc 1008 to output1 port 1014. This is a highly simplified timing model and is merely illustrative of the characteristic extraction and representation of a plurality of different signal paths between terminal pairs/sets amongst a circuit design.

Figure 12:
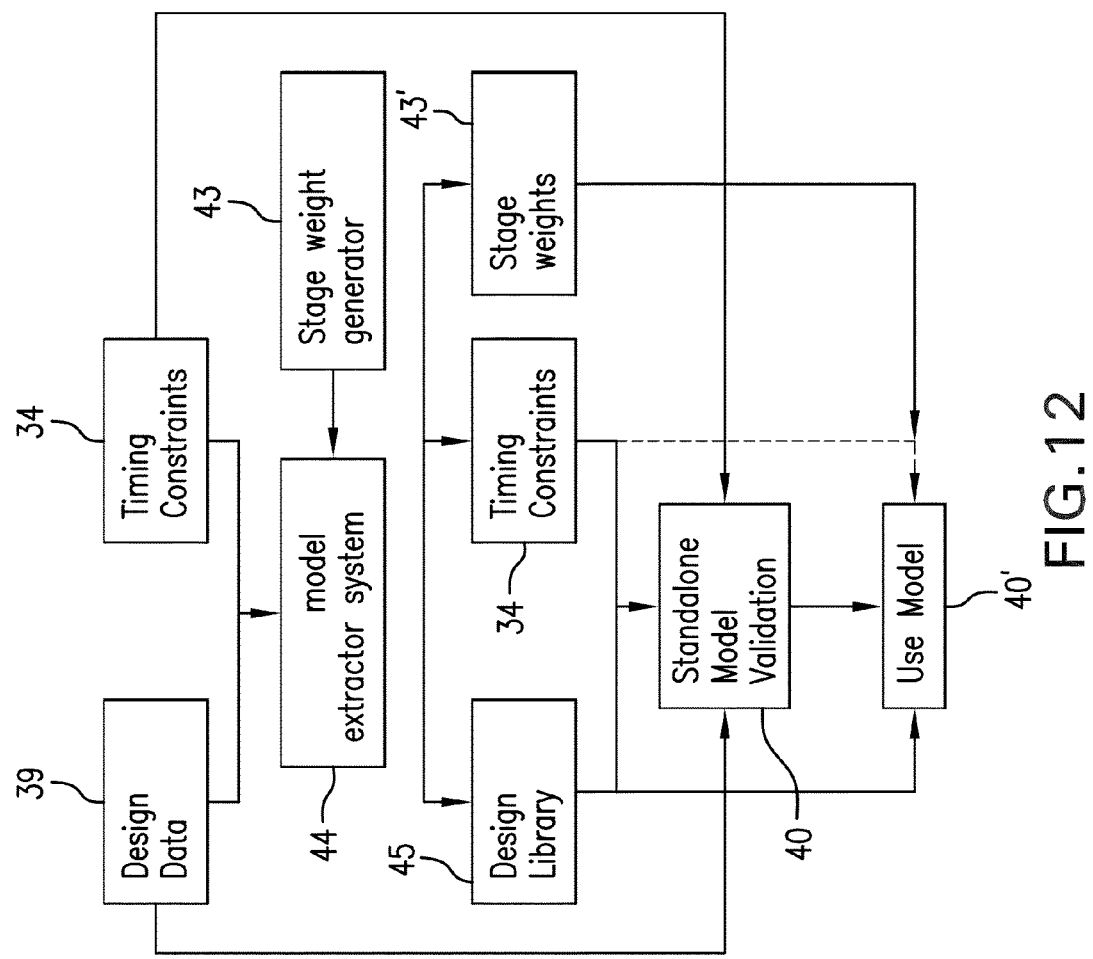
FIG. 12 is a system diagram showing a stage weight generator coupled to the model extractor system and producing a timing model along with timing constraints and stage weights thereof.

FIG. 12 shows an alternate embodiment including inputting design data 39 and timing constraint data 34 into a model extractor system 44 to generate a model according to the design data. Alternatively, the model extractor system 44 extracts portions of the design data to form the model. The required times are extracted from the timing constraint input 34. Stage weights are generated for the given functional block design by employing a stage weight generator 43 coupled to the model extractor system 44 to evaluate each of a plurality of signal paths for a given terminal set to characterize at least one of the preselected structural features of the design. In a preferred embodiment, stage counts are evaluated and compared to fairly characterize the stage weight of a representative timing arc representing one or a plurality of paths between a terminal set. The model is extracted to include associated stage weights for each path or terminal set thereof.

The stage weights may be included in the timing model such as by the re-purposing of an unused data field such as "AOCV_WEIGHT," by creation of a personalized field, or by any other field within the timing model. This allows for using a pre-established format for timing model to retain compatibility with third party tools along the EDA design flow. Alternatively, metadata, markers, tags, new data fields, or the like may be employed, or a separate file containing a lookup table utilizing a unique identifier such as a terminal pair, a signal path identifier, or the like, may be used to merely correlate and associate the external additional file of stage weights with the fully standardized timing model file.

The timing model is extracted in a preferred embodiment as a timing library such as in a .lib Liberty-based extracted timing model file 45. However, any other suitable format may be employed. Additionally, the timing constraints 34 may be propagated down and the stage weights 43' according to the stage weight generator 43 responsive to an evaluation of each of the signal paths of the circuit design.

The timing library 45 and the timing constraints 34 are selectively employed in a timing analysis such as a static timing analysis at the standalone model validation 40 within the design house. At block 40, in validation, the functional block design data 39 is checked for consistency with the timing model 45 to insure that the timing of the functional block design meets all constraints and requirements and functions as expected. Following the sign-off, a pessimism reduction process is performed upon the functional block to remove pessimism in the timing report for the functional block circuit design. Accordingly in that standalone model validation portion, the structure of the functional block is not obscured and so timing analysis, pessimism reduction, and optimization may all be performed without hindrance due to obfuscation later-applied. Once the standalone model has been validated as accurately representing the circuit design in a timing analysis, such as by running a static timing analysis on the circuit design data 39 and running the same static timing analysis on the timing library or extracted timing model 45 and comparing the two for identity therebetween, the model may be considered to be validated.

Upon successful validation, the timing model 45 may be utilized at block 40' in an hierarchical system design such as by plugging the ETM into a top-level circuit design to function as a functional block therein. The stage weights 43' either in the ETM model itself or in a standalone associated file may then be used in conjunction with the circuit design data for the top level to accurately determine structural features of signal paths passing through, ending in, or originating from, the model in the overall hierarchical system design. Thereby, a static timing analysis may be accurately performed on the entirety of the hierarchical design including the model and an AOCV or other pessimism reduction post-processing measures may be employed with accurate structural feature data though the actual implementation structure of the model is obscured or not present at all.

There are typically at least four types of timing arcs to be modeled in a timing model. The first type are timing check arcs which may include setup, hold, and the like. This models a timing arc between the input port to a first legal register as timing checks for each clock. If there are a plurality of clocks, then a worst case for each clock to any of the registers will be represented as a representative characterized timing arc.

A second type of timing arc is a latency arc. This is the arc modeled between a generated clock and a corresponding master clock. A sequential arc of a RISING_EDGE or a FALLING_EDGE type is modeled to represent the last sequential element to an output port. Lastly, a combinational arc represents an arc between an input port and an output port. The stage counts of each of these timing arcs representative of a plurality of different signal paths through the circuit designs are represented as stage weights in a preferred embodiment inside the timing model library file, such as a .LIB Liberty format file. Alternatively, the stage weights may be represented in a an associated side-loaded but separate file to maintain an association between each stage weight and a corresponding timing arc thereof, where the timing arc may be established to have a unique identifier (UID) to enable ready correlation between separate files.

The extraction or characterization of a stage weight for each timing arc is preferably performed by tracing a minimum stage count path on an arc-by-arc basis throughout the circuit design. For example, a stage count of 0 or 1 is generally considered a minimum or worst case relative to, for example, a 30 stage count path or the like. Again, it bears noting that stage count, distance, or transistor count along a specified path/set, or other structural features may be employed. A path-based cell stage count will be printed or associated with each sequential, combinational, and timing check arc. The extraction strategy for computing stage weight will be preferably performed to include a data path stage weight where the stage weight is computed by tracing the minimum stage weight among all possible paths for a given arc. This stage weight may be characterized by analyzing in some cases possibly millions of associated timing paths.

Secondly, the clock path stage weight is computed preferably by reusing the stage weights determined during a graph-based (GBA) or path-based (PBA) static timing analysis upon the circuit design. However, in some alternate embodiments, the clock path may be traced without relying upon the graph-based analysis results. Each clock path may be traced to have a specific stage weight thereof taking account common path pessimism removal (CPPR).

In the event that a CPPR has already been performed to reduce pessimism in common path portion between launch and capture flip flop or register pairs, the AOCV stage weight should be computed without regard to the common path portion. Thus, when tracing from a clock route, the stage count is reset at the last possible branch point between the launch and capture pair.

Figure 13:
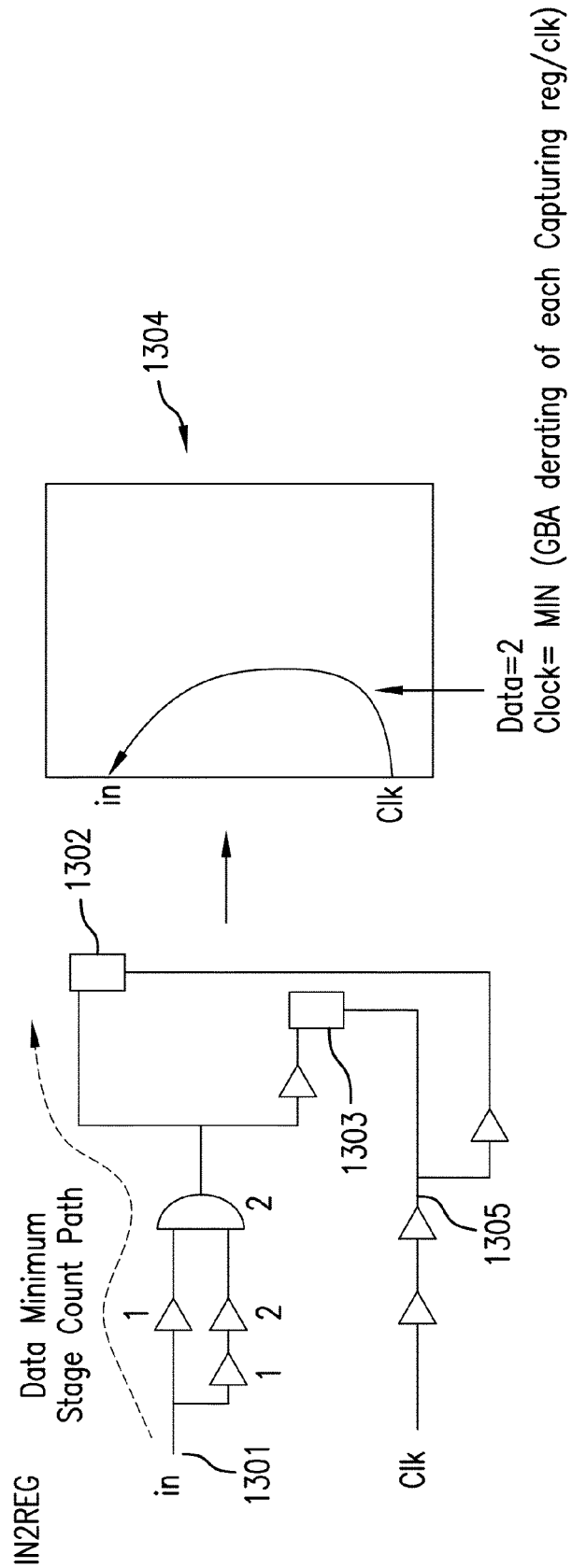
FIG. 13 is yet another circuit design showing illustrative calculation of representative structural characteristic of a signal path thereof.

As seen in FIG. 13, the stage weight characterization may be performed in a number of ways. In a first approach, a terminal pair between the input port 1301 and register 1302 are selected responsive to a selection unit. This selection is made according to the input port terminal on one end and a register port terminal to register 1302 on the other end. Such a terminal pair is seen to qualify under the selection process as an input to register pair. Following this determination and selection, a plurality of alternate candidate signal paths connect input terminal 1301 to register terminal 1302. A first path may be through an upper section including the one buffer and an AND gate to arrive at the register. This would result in a stage count of 2. An alternative path from input port 1302 passes through a lower segment including two buffers, the AND gate, and arrives at the register input port 1302. This alternative signal path would have a stage count of 3. Comparing the two to arrive at a worst case would result in the first path passing through the single buffer member and the AND gate. Thereby, the worst case stage count of 2 being the lowest and having the lowest AOCV factor to remove the least amount of pessimism and therefore ensure an accurate and fully functional model may be employed.

Alternatively, if an input to register set among the same clock signal is to be performed, the two additional paths become apparent: The input port 1302 to the input port 1303 of a second register on a common clock (CLK) with a first register 1302. In this instance, the first two paths stage weights of 2 and 3 respectively are considered relative to second and third paths passing through the same buffers and AND gate but also now traversing through a lower section including an additional buffer to arrive at the second register 1303. There is an additional buffer but it can be assumed that a greater stage count is present in both of the two new additional alternative signal paths and they may be summarily excluded. However, for clarity and completeness of disclosure, it is seen that a first path passes from the input port 1301 through a first buffer, the AND gate down through an additional buffer and arriving at the second register input terminal 1303. This alternate signal path would have a stage count of 3 which is again higher than the previous two alternate signal paths. Lastly, a signal traverses from the input port 1301 through a lower section passing through two buffers, the AND gate, and an additional buffer, and then arriving at the second register input port 1303.

Considering a worst case amongst all four possible paths on a common clock from input to register may be characterized as a worst case stage count of 2. This worst-case analysis is merely illustrative—as a worst case, a best case, an average, or any other measures for computing a characterized or representative structural feature of the timing arc may be employed. Additionally, any number of registers may be employed by selecting whether to have one timing arc representative of each input to each register or one timing arc representative of each input to all registers for each clock. Certain trade-offs according to such factors as memory size, storage size, temporary memory usage for the timing model, run time processor usage for the model itself, and integrated timing analyses cooperatively executed with the top-level of the hierarchical design, amongst other factors, may impact this decision.

Thus, it is seen at 1304 that a timing model having a timing arc representative of the input port 1301 to the worst-case register selected from 1302 and 1303 on a common clock signal is determined and represented in the timing model as a timing arc with a representative stage weight of 2. This concludes the data calculation portion. In an alternate embodiment, a clock stage weight is determined as well. At least two illustrative measures for computing a representative clock stage weight are described, whereas others are omitted for clarity and brevity. In a first instance of a clock stage weight characterization, the graph-based analysis (GBA) derating of each capturing register and clock pair are reused to represent the clock stage weight. Alternatively, a process similar to the data characterization may be employed where a first signal path and an alternate signal path from the clock to the first register 1303 are employed whereby a stage count of 1 to 2 as an initial matter is calculated. However, due to the common branch point at 1305, this stage count of 2 is reset to 0, so the first path has a stage count of 0 and following 1305 in an alternate lower section of the alternate signal path, a first buffer is encountered and thus, a stage count of 1 to reach the second register 1302 along a clock path from the common branch point 1305. This signal path to the register 1302 will have a stage count of 1. Characterizing between a stage count of 0 and a stage count of 1, in a worst case analysis, the stage count of 0 would be propagated forward to represent the worst case timing arc between the clock and each of the corresponding register pairs.

Figure 14:
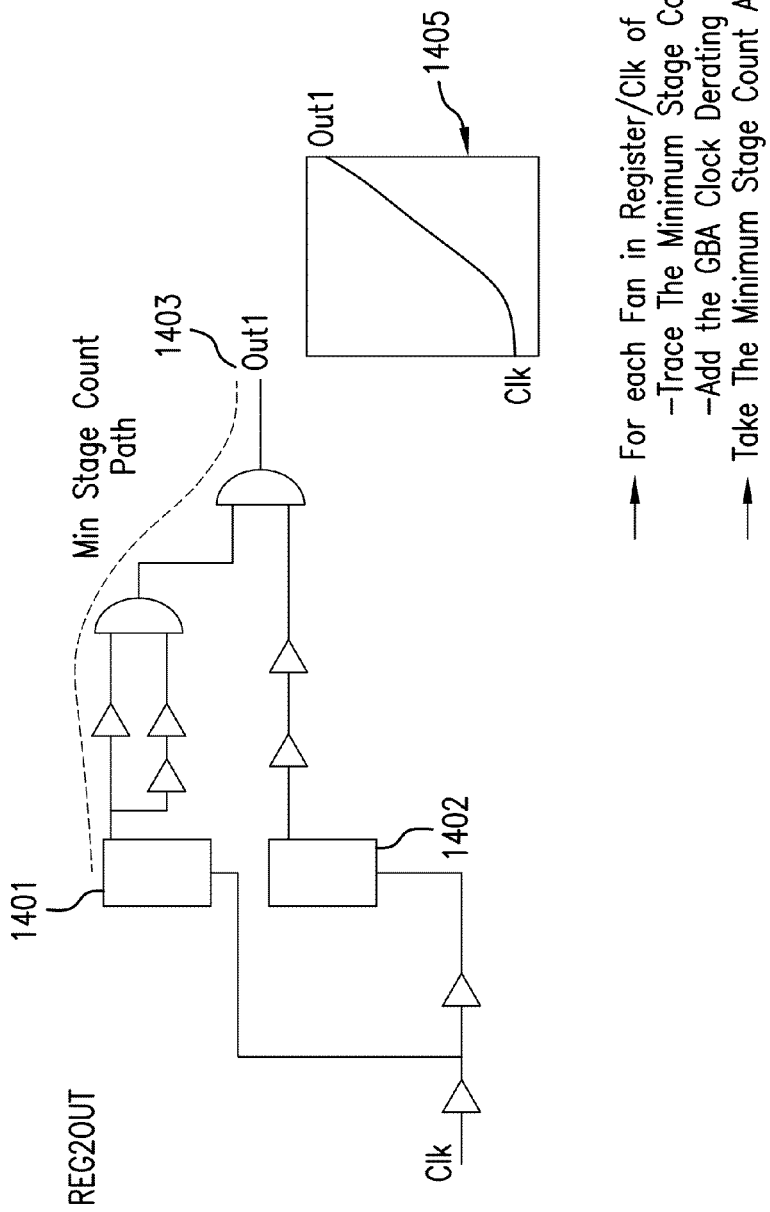
FIG. 14 is another circuit design showing another representative structural characteristic of the circuit design.

With regard to FIG. 14, a characteristic or representative data stage weight and a representative clock stage weight will be performed. It is seen that a register pair 1401 and 1402 share a common clock (CLK). The terminal pairs between first register 1401 and output1 port 1403 as well as the second register 1402 to output1 port 1403 signal terminal pairs are considered. Between the first terminal pair 1401 and 1403, a plurality of alternative or candidate signal paths exist. A first path includes a segment containing one buffer, an AND gate, and a second AND gate before reaching the output1 port 1403. This candidate signal path has a stage count of 3. A second candidate path between the first register 1401 and the first output 1403 takes a lower segment having two buffers, and two AND gates, resulting in a stage count of 4. Between the two alternative signal paths between the terminal pairs of 1401 and 1403, the three stage count path would be a worst case and would be utilized to characterize or represent the terminal pair 1401 to 1403 as a representative stage weight structural feature associated with a timing arc.

As it has been determined that the register pairs 1401 and 1403 share a common clock (CLK), the timing model in some embodiments may be compressed or reduced in size yet further to include a worst case, not only amongst terminal pair 1401 and 1403, but indeed all registers stemming from the same clock signal and arriving at the same output gate 1403. In this instance, the worst case stage count of 3 would be considered relative to a stage count of 3 as well, stemming from register 1401, passing through two buffers, and an AND gate to arrive at output1 port 1403. In this instance, the representative stage weight of 3 would be used to represent the register to output port timing arc of the timing model 1405. Additionally, the clock stage weight may be considered as well and in this instance, it may be seen that tracing from the clock signal (CLK) through a first buffer to arrive at the first register 1401 would have a stage count of 1 compared to a signal traversal from the clock through two buffers to arrive at the second register 1402. In this instance, the one buffer route to first register 1401 would be the worst case and would be used as a representative stage weight for the clock signal in the timing arc 1405. Alternatively, rather than re-computing stage weights for the clock portion, the stage weights thereof may be reused from the graph-based analysis portion of the timing analysis already performed on the circuit design.

Figure 15:
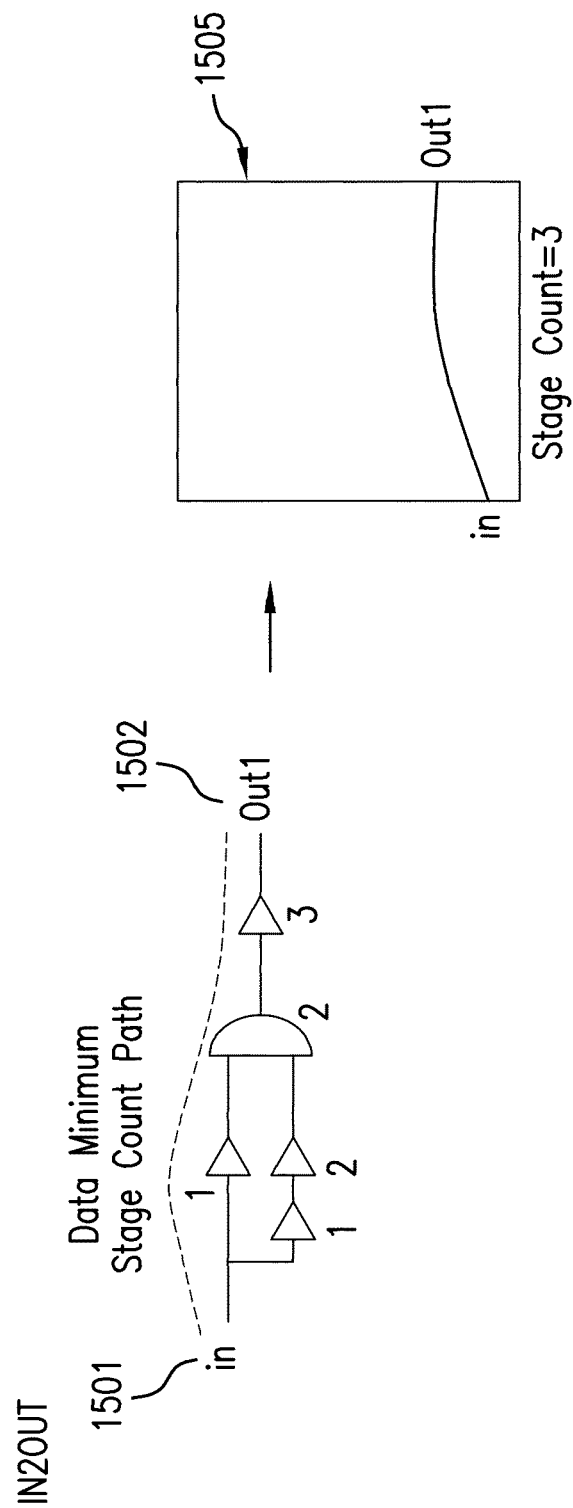
FIG. 15 is another circuit design showing another representative characteristic and a corresponding representation as an extracted timing model having a timing arc illustrative of the representative characteristic of the exemplary circuit design extracted in accordance with an exemplary embodiment of the present invention.

As seen in FIG. 15, a combinational timing arc is modeled for the illustrative circuit design portion stemming from input port 1501 and arriving at port 1502. No intermediate registers, memory elements, or flip-flops are presented, and thus, a straight input to output port combinational path will be modeled as a timing arc herein. The terminal pair input 1501 to output1 port 1502 is considered and is seen to have two alternative candidate signal paths. A first signal path stretches from the input port 1501 through two buffers, an AND gate, and a third buffer having a stage count of 4 before arriving at output port 1502. A second alternative candidate signal path traces from input terminal 1502 through a first buffer, and an AND gate, to have a stage count of 3. The stage counts are worst-cased to arrive at a worst case stage weight of 3 to represent the combinational timing arc in the timing model representative of the circuit design.

Timing arc structural weight may be stored in the timing model as user defined data attributes, for example, as such (The first attribute is used for combinational and sequential arcs and will be dumped at arc level as seen below. The check arcs are dumped with two separate stage weights, one for data and one for clock.):

```
define ("aocv_weight","timing","float");
define ("clock_aocv_weight","timing","float");
timing ( ) {
timing_type: combinational;
timing sense: positive_unate;
aocv_weight: 4;
}
timing ( ) {
timing_type: setup_rising;
``` aocv_weight: 4;
clock_aocv_weight: 3;
}

The characteristic stage weights of the previous examples may be stored in the timing model itself or in an associated file. One preferred manner of storing the weights is to create a user defined attribute within the library or timing model such as AOCV weight. The AOCV weight may be defined to be a floating point timing type variable, structure, class, or the like. Indeed, any data structure allowed within the format may be employed. Alternatively, metadata may be employed in an out-of-bound portion of the file so as not to complicate compatibility between the timing model format and a third party or other tools in the EDA design flow. The timing type of class or structure may have a plurality of attributes or a plurality of sub-fields including defining the type such as sequential, combinational, or timing check. The timing sense may be defined to include the positive UNATE, the negative UNATE, non-UNATE, and the like. Such timing sense might indicate a rise-rise, a fall transition, fall condition, or the like. Additionally, the clock weight may be saved separately from the AOCV or the data stage count. Any data structuring known to one of ordinary skill in the art may be employed herein.

Such data may be stored either in-line or out-of-bounds, in the timing model, or in an associated third party file. The data may be read by the timing analysis module or the pessimism reduction sub-modules later to determine stage weight of a structural feature of each signal path or terminal set of the circuit design represented in the timing model as a timing arc to thereby reduce pessimism according to the derate table.

To more fully elaborate upon the data path AOCV stage weight computation strategy, the following paragraphs have been included. However, they are to be taken as non-limiting and merely explanatory of an illustrative example where a timing arc represents a worst case between, for example, a first terminal and all of a second type of similarly situated terminals. An AOCV weight for timing checks and combinational arcs (any timing arcs with an input port as one of the two terminal pairs) will first have all of the input ports of the design identified. The regular and generated clock routes are included on the instance pins as there may be a path from a clock route to a sequential element or an output port. The input pin list is preferably split into groups of n elements. Typically, n can be 10; however, n may be any number according to run time or memory constraints of the system. 10 is chosen as a preferred number for clarity; however, any number may be employed. The splitting is done to avoid run time of cone marking m times for each input pin. Also, all pin generation is not done in one pass to avoid memory overhead. However, as memory capacities increase and processor speeds and availability increase, the limiting of n or splitting of pins may be omitted in certain embodiments.

Figure 16:
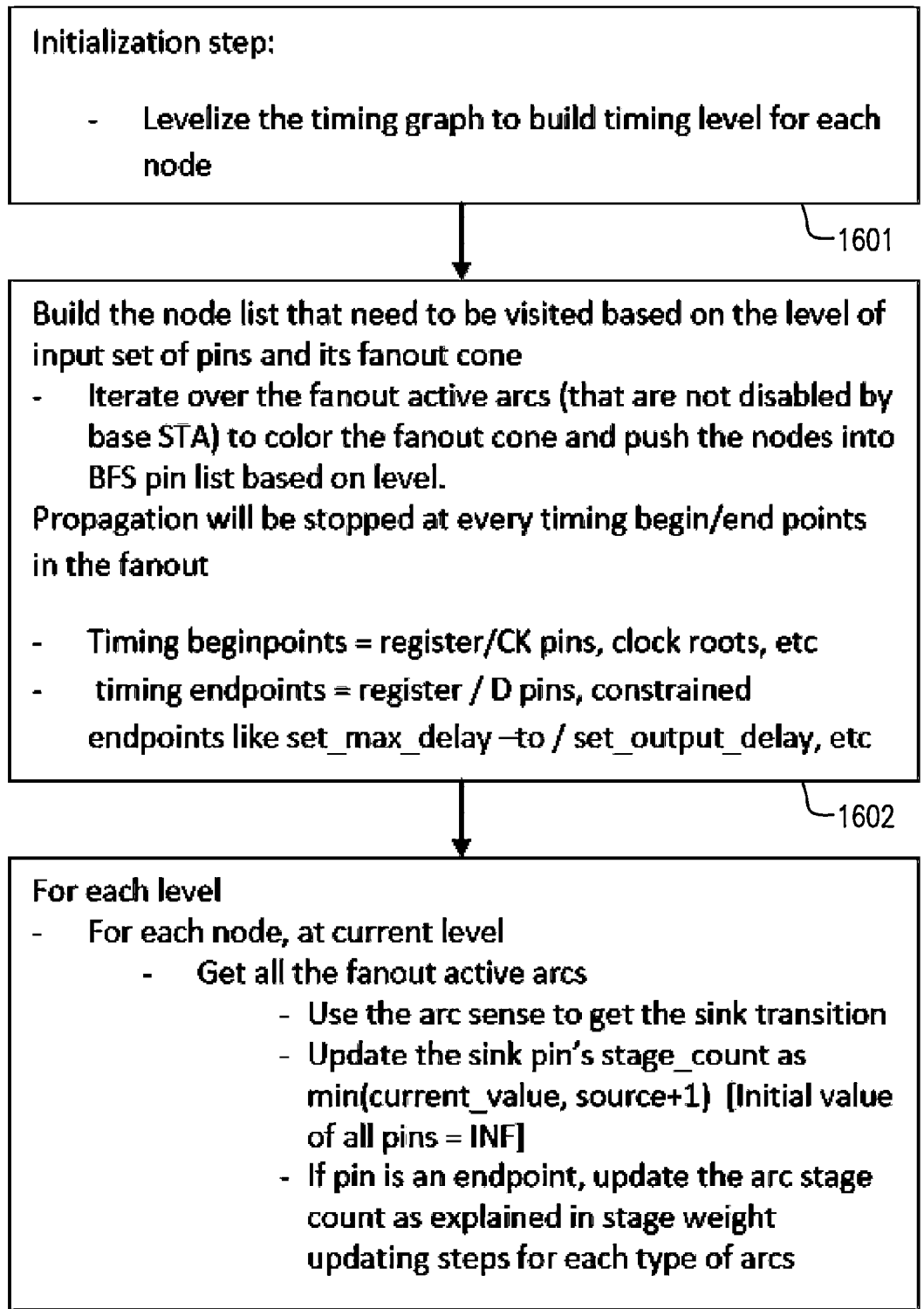
FIG. 16 is an illustrative breadth first search (BFS) stage weight update algorithm in accordance with an exemplary embodiment of the present invention.

For each group of input pins, a breadth first search approach (BFS) stage weight update function, as seen in FIG. 16, is executed. The input pins stage counts are propagated to the fan out end points of each signal path or terminal pair. If the timing end point is encountered, the end point is characterized into different possible arc types by evaluating the type of node and connected timing checks to that node. Several possible arc types include a SET_RISING/SET_FALLING; a HOLD_RISING/HOLD_FALLING; RECOVERY_RISING/RECOVERY_FALLING; REMOVAL_RISING/REMOVAL_FALLING; COMBINATIONAL/NON_SEQUENTIAL_ARCS/CLOCK_GATING TIMING CHECK, and the like. Such arc type generally will be stored as a timing type in either the timing model or an associated external file thereof.

The reference clock information is then acquired for each acquired end point as the base timing analysis has already been performed. The clock information is acquired on all of the reference nodes of the connected timing checks. The clock stage count is captured using a clock stage count strategy discussed below. A table or any data structure as would be known to one of skill in the art allowing quick access, sorting, and ranking may be employed and maintained. The table is employed to store a minimum stage count based on a key of a tuple type where the tuple is preferably defined by the input pin, the arc type, and the capture clock. Thus, for each unique input pin, arc type, and capture clock, a unique timing arc will exist. Associated with that unique identifier of a key, the minimum stage count or stage weight of each timing arc is defined. Subsequent removal is based on the key formed by a tuple which is a three part unique identifier including the input pin, the arc type, and the capture clock. Associated with the unique identifier or key is a value of a stage weight or stage count of a structural feature.

The AOCV weight for sequential arcs from clock to an output port is determined by acquiring all of the output ports of the design such as by a survey of the net list or the like. The output pin list is again preferably split into groups of n elements where n is preferably 10, though any number may be used according to available system memory, processing resources, and available time. For each group of the output pins, the BFS stage weight update as seen in FIG. 16 is executed in reverse mode to propagate the output pin stage count to the fan in pins. If the timing end point is encountered, the begin point is categorized into different possible arc types where a possible arc type in this case may be a RISING_EDGE or a FALLING_EDGE for example. The launching signal clock information is acquired for each beginning point (in this case, the beginning point is the CLOCK_PIN of the last sequential element that is connected to the output port).

The launch clock stage weight is acquired using a clock stage count strategy discussed below. Again, a table is maintained to store the minimum stage count or stage weight based upon the tuple key of the output pin, arc type, and signal clock. For each unique combination of output pin, arc type, and signal clock, a value is associated therewith and maintained in the table where a value is a determined stage weight or structural feature of the key.

As seen in FIG. 16, the breadth first search (BFS) stage weight update algorithm is shown. In block 1601, an initialization step is undertaken to levelize a timing graph to build a timing level for each node. In some instances, such a step may already be performed as part of a base timing analysis and a timing graph therefrom may be reused. At block 1602, the node list is built of nodes that need to be visited based on a level of input set of pins and its fan-out cone. The fan-out active arcs that are not disabled by the base static timing analysis are iterated over to color the fan out cone and push the nodes into a breadth first search (BFS) pin list based on level. Propagation will be stopped at every timing begin/end point in the fan-out. A timing begin point may be a register/clock pin, clock route, and the like. A timing end point may be a register, D pin, a constrained end point like SET_MAX_DELAY, or SET_OUTPUT_DELAY, or the like, defined by a user according to preferences or properties particular to the circuit design. For each enumerated level, an outer loop will be performed and an inner loop of each node at that level. For each node, all of the fan-out active arcs are acquired or identified and the type of arc or arc sense will be used to get the sink transition. The sink pins stage count is updated as a minimum of the current value as compared to a source +1. The initial value of all pins is set to be INF. If a pin is an end point, the arc stage count is updated as explained in the stage weight updating steps for each type of arc. Such BFS stage weight algorithm is shown in illustrative manner in a forward mode, and a reverse mode is omitted for clarity purposes. However, in a reverse mode, the BFS is initialized from the output ports going in a leftward, backward, or upstream direction from the output ports. This reverse BFS is beneficially used to avoid identification of a last set of registers separately.

Figure 17:
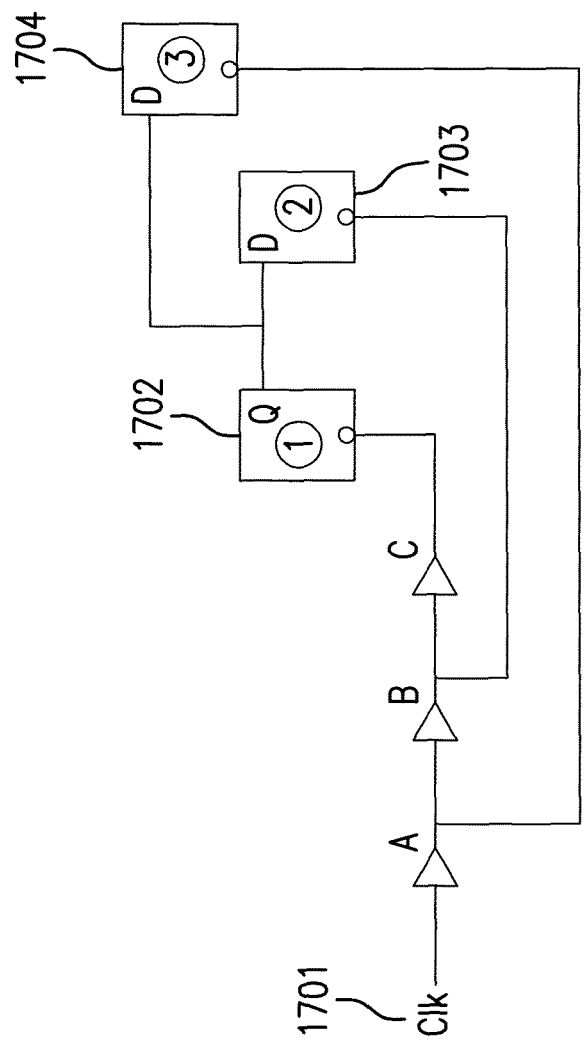
FIG. 17 is another simplified circuit design illustrating a clock to register timing arc with consideration of a previously performed common path pessimism removal (CPPR)

As seen in FIG. 17, a clock path AOCV stage count computation strategy is disclosed. Computation of the stage weights in a clock network is challenging due to a reconvergence in points at which clock path pessimism removal may have already been performed. On clock reconvergence points, the stage count needs to be reset as the AOCV concept is applied on a timing path only beyond the common path pessimism removal (CPPR) point. Therefore, on clock nodes, the base timing analysis generated stage count at the register clock pin is taken. For example, in the case of FIG. 17, one cannot take the clock stage count of 3 with regard to register 1 because the path from 1 to 3 has a CPPR point as B with a total number of stages between branch point to register clock point equals 1. Additionally, the path between register 1 and register 2 will have a CPPR point of A with a total number of stages between branch point to register clock pin equal to 2. If we take more than one stage count for register 1 to 3 path, then the results will be optimistic and wrong because we will violate the basic definition of AOCV where only the stage count beyond the CPPR branch should be considered for computing AOCV rates. Therefore, taking the minimum of all paths, clock stage count gives us 1. For a launch capture pair of 1 and 3 as an illustrative case, a tracing is started at the clock point 1701 to traverse the first buffer at point A. However, at the branch point immediately following A, the stage count is reset to 0, tracing further past the buffer at B is a stage count of 1, past the buffer at C results in a stage count of 2 to arrive at the clock pin of the first register 1702. For the corresponding capture register 1704 the count begins at the clock 1701, traverses the buffer at point A, however, at the common branch point between launch register1 1702 and capture register 3 1704, the structural feature or stage count is reset to 0, which then traverses through the lowermost segments to arrive at the third register 1304. A worst casing is performed on the stage count of 2 vs. the stage count of 0 which results in a worst case stage count of 0 of all clock pins to all registers.

While GBA has been discussed in earlier examples, PBA or other varieties of timing analysis and their intermediate work product may be utilized. In the previous section, the graph-based stage weight generation strategy was utilized where the pessimistic stage count was generated by taking the minimum among all possible timing paths that are possible for any timing arc. The same approach may be used for a path-based stage weight whenever the timing model generation is being done in PBA mode. In such cases, instead of taking the pessimistic view, we may utilize the exact stage weight of the PBA enumerated path. Such reuse of the PBA path weight ensures no pessimism in the final inserted stage counts on the extracted timing model. Thereby, when the timing model is stitched in to a top level of a hierarchical circuit design, a realistic analysis is performed, resulting in improved power/performance/area (PPA) characteristics of the circuit design.

Figure 18:
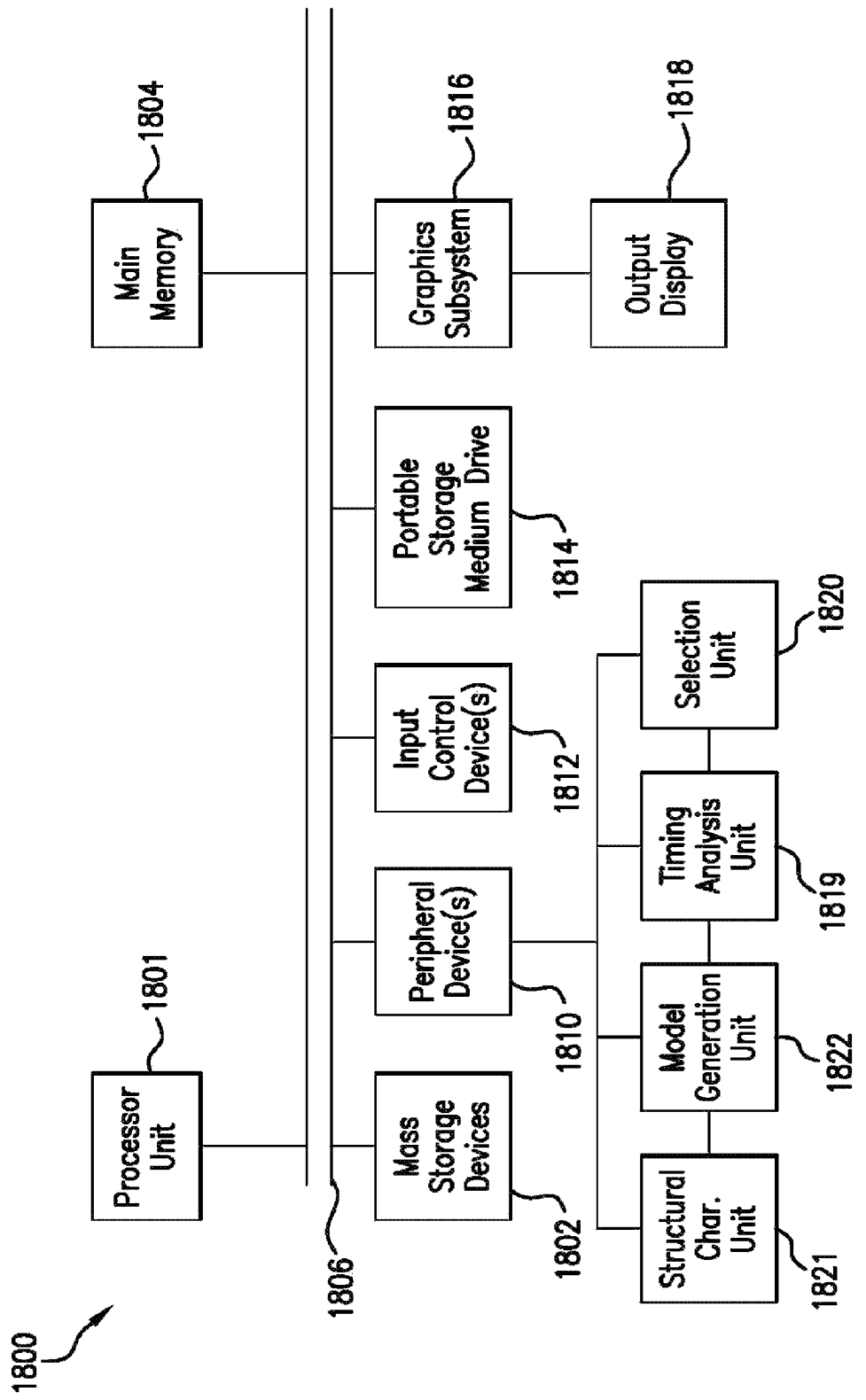
FIG. 18 is a block diagram illustrating an interconnection of components in a processor-based system for implementing an exemplary embodiment of the present invention.

Turning to FIG. 18, an illustrative block diagram of a computer system for hosting and/or executing an exemplary configuration of the disclosed system and method respectively is illustrated. A computer system 1800 contains a processor unit 1801, a main or primary memory 1804, an interconnect bus 1806, a mass storage device 1802, peripheral device(s) 1810, input control device(s) 1812, portable storage drive(s) 1814, a graphics subsystem 1816, and an output display 1818, amongst other components (components may be used herein at varying levels such as a transistor, gate component, or a black-box type component such as, for example, the main memory component). System 1800 may be incorporated into a system on chip (SOC), such as the illustrative circuit design seen in FIG. 1A. Processor unit 1801 may include a single microprocessor or a plurality of microprocessors for configuring computer system 1800 as a multi-processor system, additionally, each physical processor unit 1801 may include a plurality of cores. Main memory 1804 stores, in part, instructions and data to be executed by processor 1801 along with circuit design data including circuit design, operational timing data, topology data, and structural data, amongst other relevant data. Main memory 1804 preferably includes banks of dynamic random access memory (DRAM) as well as high-speed cache memory, such as static random access memory (SRAM) at various levels of the system architecture.

For the purpose of simplicity, the components of computer system 1800 are shown connected via interconnect bus 1806. However, computer system 1800 may be connected through one or more data transport means. Mass storage device 1802, which may be implemented with a magnetic disk drive, an optical disk drive, a solid state device such as a flash device, an attachment to network storage, cloud storage, a RAID arraying any of the above, and the like, is preferably a non-volatile storage device for storing data, databases, and instructions, to be used by processor unit 1801. In certain configurations, mass storage device 1802 may store portions of the software to load it into main memory 1804 or into a firmware or rom. Mass storage device 1802 is preferably employed to store and provide access to circuit design data, timing graph, timing database, and a CPPR tag tree including an hierarchical tag hash table. Such databases, data stores, tables, and physical implementation circuit design data and the like are preferably retrieved from mass storage device 1802 and stored in main memory 1804 to provide faster reading and writing access thereto. Periodic synchronizing measures will be taken between the volatile main memory 1804 and non-volatile mass storage devices 1802 to ensure data archival.

Portable storage medium drive 1814 operates in conjunction with a portable non-volatile storage medium such as a floppy disk, a compact disk read only memory (CD-ROM), or a digital versatile/video disk read only memory (DVD-ROM), to input and output data and code to and from the computer system 1800. In one configuration, software portions, circuit design data, and the like are stored on such a portable medium, and are input to computer system 1800 via portable storage medium drive 1814.

Peripheral device(s) 1810 may include any type of computer support/extension device such as an input/output (I/O) interface, such as, for example PCI express or gigabit Ethernet, though any suitable IO, backplane, or other suitable interface may be employed to add additional functionality to computer system 1800. For example, peripheral device(s) 1810 may include additional network interface cards to interface computer system 1800 to additional networks, servers, clusters, farms, or facilities, such as a separate semiconductor fabrication plant. Peripheral devices may include further specialized processors such as clustered video cards utilizing graphics processor unit (GPU) floating point processing logic to supplement or supplant CPU processing. Dynamically configurable logic such as, for example, field programmable gate arrays (FPGAs) may also be coupled to system 1800 through peripheral device(s) block 1810. Still further, specialized application specific integrated circuits (ASICS) may be coupled thereto to implement specialized logic to accelerate or implement certain portions of the invention such as a timing analysis module, a model extraction unit, and a weight generation, or selection module. Such modules may be given direct memory access (DMA) and may have their own memory integrated therein. Additionally, a rapid circuit prototype fabrication unit may be coupled to the system via a backplane, system IO port, network connection, or the like. Such fabrication unit may include, for example, a lithographic or 3d additive printer, operable to physically fabricate a circuit design defined by physical implementation data. An IC product prototyping machine/(s) produces a prototype physical IC product embodying at least one circuit design such as by combinations of optical lithography, etching, carbon vapor deposition (CVD), additive 3$d$ printing, or the like, though any suitable measures for fabricating an IC product embodying the transformed circuit design may be employed.

A physical placement and routing optimizer, STA coprocessor or FPGA device, AOCV module, and via perhaps a network connection, an IC fabrication facility with one or a plurality of fabrication devices, are preferably coupled to system 1800 via peripheral devices 1810 though any suitable connection may be employed. STA processor/(s), Optimizer/fixer module, weight characterization unit, and the like may also be integrated with processor unit 1801.

In an alternate embodiment, a Structural Characterization Unit 1821 may be coupled to a peripheral devices interconnect 1810. Structural Characterization Unit is coupled to a Model Generation Unit 1822. A Timing Analysis Unit 1819 is coupled to a Selection Unit 1820. The Timing Analysis Unit 1819 executes to perform at least one timing analysis on a subordinate circuit design. The Timing Analysis Unit 1819 may also be employed to perform at least one timing analysis on the hierarchical circuit design including the parent circuit design and the subordinate design (represented by a timing model). The Selection Unit 1820 selects each pair of terminals from terminals of the circuit design according to a type thereof (input to output terminal pairs, input to register terminal pairs, and register to output terminal pairs). Selection Unit 1820 additionally sorts the selected pairs by type and selectively associates pairs having a common clock and input or output terminal for eventual representation as a timing arc characterizing a stage weight of the paths. A Model Generation Unit 1822 generates a timing model such as, for example, a Liberty .Lib Extracted Timing Model (ETM) to represent the subordinate circuit design. Structural Characterization Unit 1821 executes to generate a structural or stage weight to characterize and represent each type of terminal pair (e.g. IN2OUT, IN2REG, REG2OUT) based on at least one preselected structural feature of each path thereof. The representative stage weight is then associated with its corresponding type of terminal pair set in the timing model to form a hybrid timing model.

Input control device(s) 1812 provide a portion of the user interface for a computer system 1800 user. Input control device(s) 1812 may include an alphanumeric keypad for inputting alphanumeric and other key information; and a cursor control device such as a mouse, a track pad or stylus; or cursor direction keys.

In order to display textual and graphical information, computer system 1800 contains graphic subsystem 1816 and output display(s) 1818. Output display 1818 may include a cathode ray tube (CRT) display, liquid crystal display (LCD), active matrix organic light emitting diode (AMOLED), plasma display, projector, or the like. Graphic subsystem 1816 receives textual and graphical information and processes the information for output to display 1818.

In a software implementation, portions of the software for certain measures may include a plurality of computer executable instructions, to be implemented on a computer system such as system 1800. Prior to loading in the computer system 1800 or firmware, the software may reside as encoded information on a non-transitory computer-readable tangible medium such as a magnetic floppy disk, a magnetic tape, CD-ROM, DVD-ROM, flash memory, network attached storage (NAS), or any other suitable computer readable medium. Such software may control multiplexors, selectors, field programmable gate arrays (FPGAs), ASICS, or the like to implement logical control of certain features herein, such as, for example, timing analysis, path propagation, back-tracing, weight characterization, stage count determination, physical implementation optimization features, and the like.

In an illustrative implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Figure 19A:
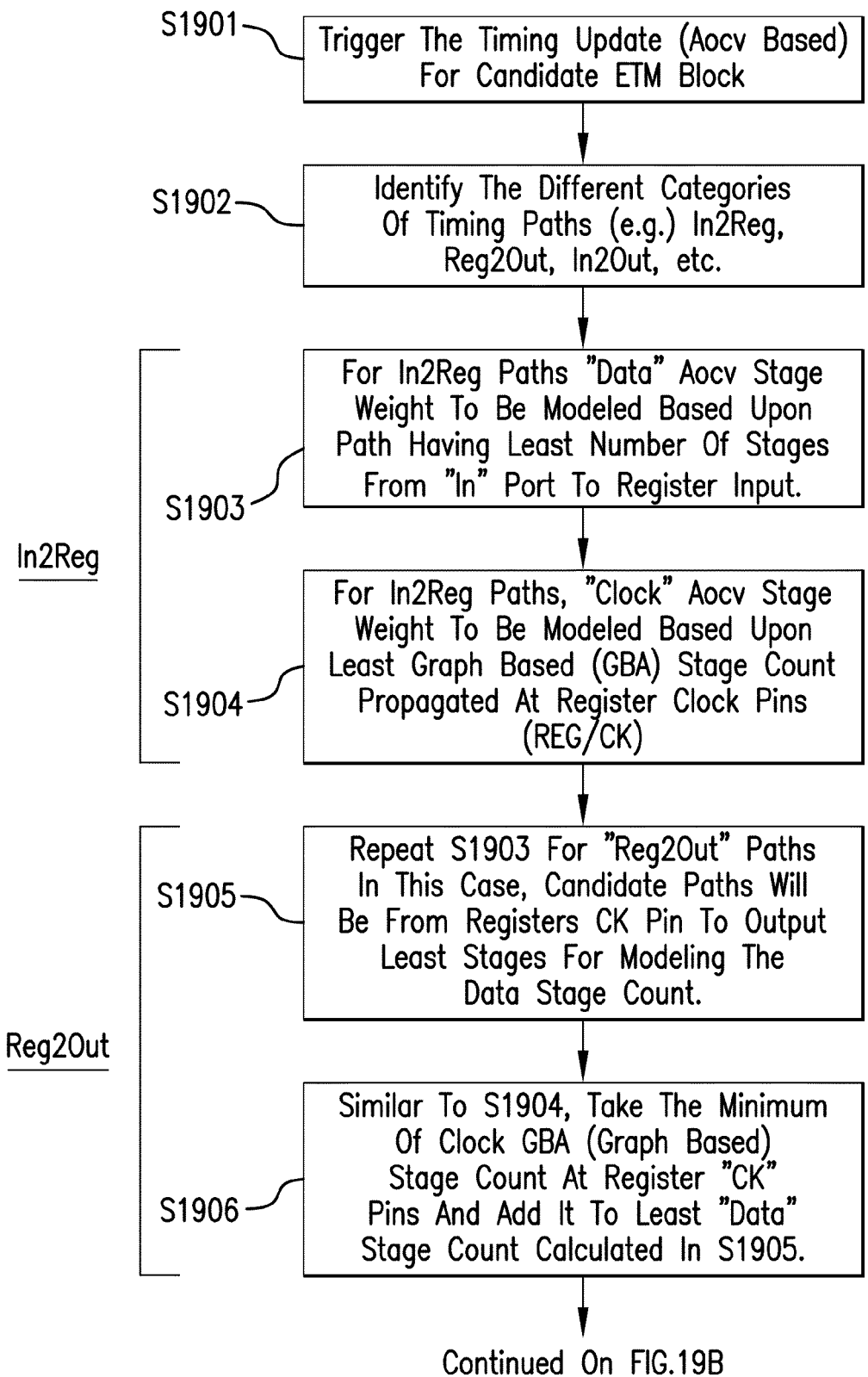
FIGS. 19a-19b are flow diagrams illustrating a flow for determining clock timing path stage count in accordance with an exemplary embodiment of the present invention; and, FIG. 20 is a flow diagram illustrating a flow for determining data path stage count in accordance with an exemplary embodiment of the present invention.

Turning to FIG. 19A, a timing update (AOCV based) is performed for a circuit design of a candidate IP functional block at S1901. The different categories of timing paths such as, for example: In2Reg, Reg2Out, and In2Out are identified in the candidate circuit design at S1902. At block S1903 identified In2Reg paths (paths extending from an input to a register), the data AOCV stage weight to be modeled is based upon the path having the least number of stages from the in port to the register input. For these same In2Reg identified paths, the Clock AOCV stage weight to be modeled is based upon the least Graph Based Analysis (GBA) stage count propagated at register clock pins (REG/CK) as seen at S1904.

Figure 19B:
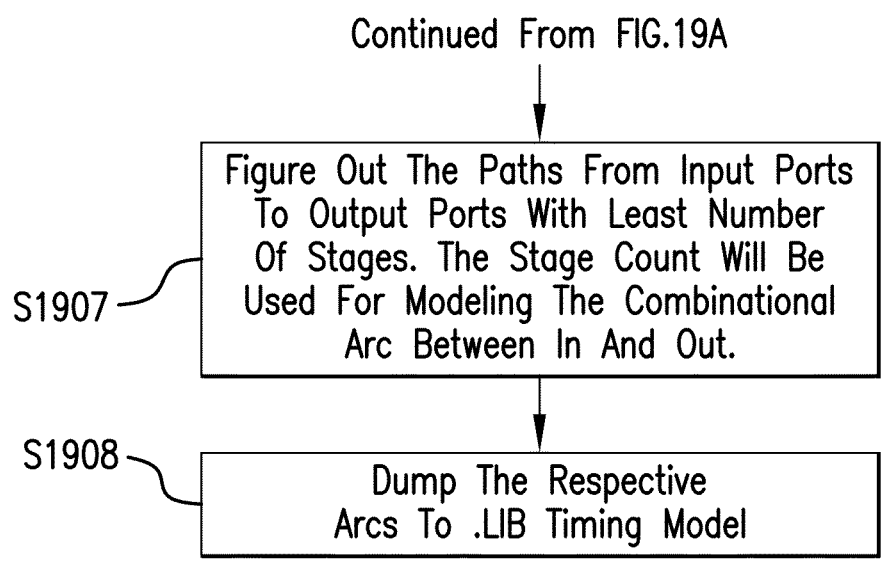

At S1905, for each Register to Output path (Reg2Out) the same analysis at block S1903 is performed. In this case, candidate paths will be from each register CK pin to an Output port. The least stages for modeling will be employed for the data stage count. At S1906, similar to block S1904, the minimum clock GBA stage count at the register CK pin is taken and added to the least data stage count calculated at S1905. The flow continues to FIG. 19B where, in block S1907, the paths from the input ports to the output ports (In2Out) with the least number of stages are determined. This stage count is used for the modeling of combinational arcs between in and out. At block S1908, the stage weights determined for each of the types of paths (In2Reg, Reg2Out, In2Out) will each be associated and stored into the hybrid timing model as discussed above.

Figure 20:
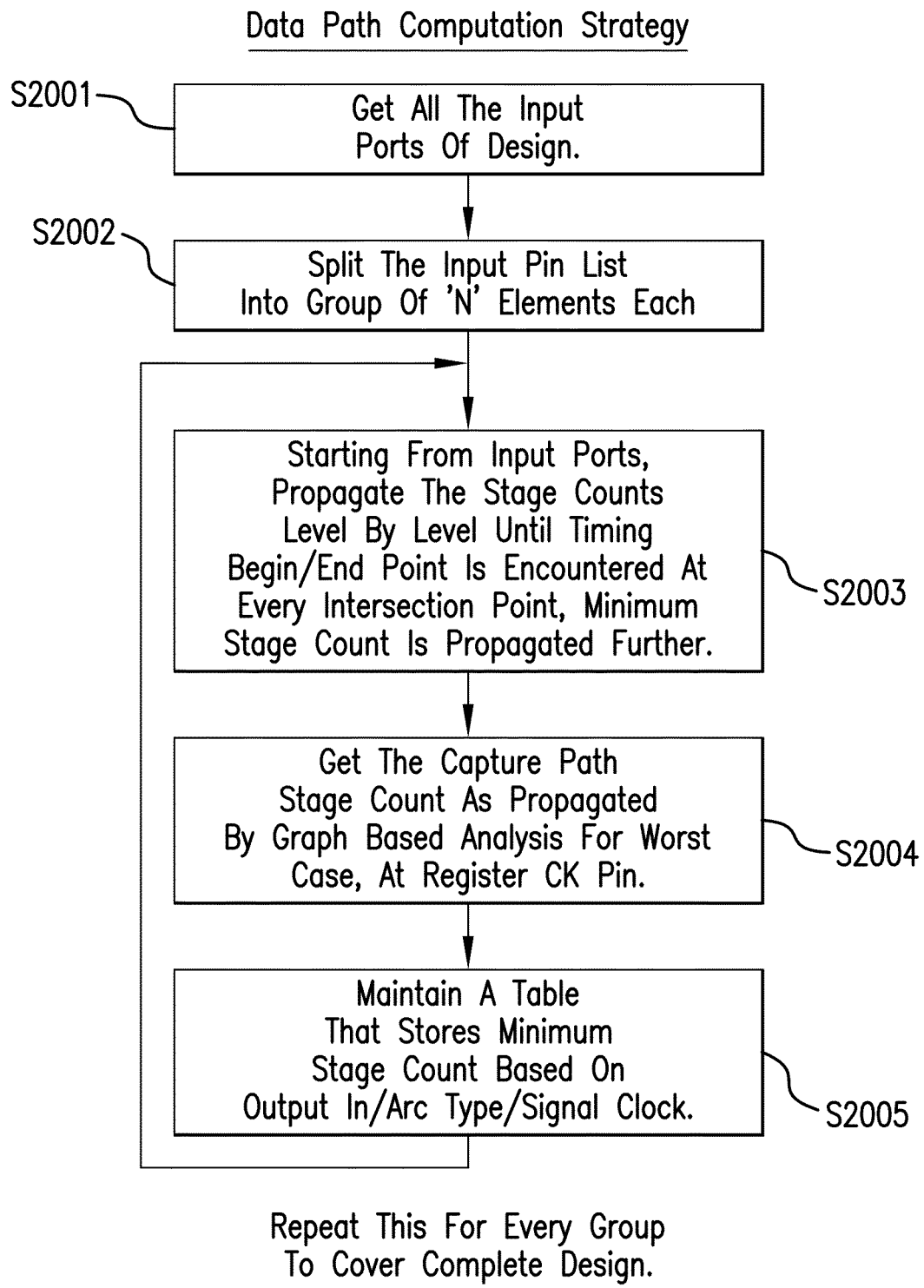

As seen in FIG. 20 a data path computation flow is illustrated. At block S2001 all of the input ports of the circuit design are identified. At block S2002 the input pin list is split into groups of N elements each. N may be illustratively set as "10" however any suitable number may be employed in accordance with available system memory and runtime allowance. Starting from the input ports, the stage counts are counted and propagated level by level until the timing begin/end point is encountered as seen in block S2003. At every intersection point, the minimum stage count is propagated further.

At S2004, the capture path stage count for a register (as propagated by the GBA worst case) is identified at the register CK pin. A table is instantiated and maintained at S2005. The table maintains the minimum stage count based on a tuple of Output pin and Arc Type and signal clock as S2005. Thus, for a different value in any of the three tuple dimensions, a different stage count is maintained. The flow then loops back to repeat from block S2003 for every group (previously divided) for the circuit design.

Although this invention has been described in connection with specific forms and configurations thereof, it will be appreciated that various modifications other than those discussed above may be resorted to without departing from either the spirit or scope of the invention. For example, equivalent elements may be substituted for those specifically shown and described, certain features may be used independently of other features, and in certain cases, particular combinations of circuit design and implementation flow of processing steps may be reversed, interposed, or mutated, all without departing from the spirit or scope of the invention as defined in the appended claims.

What is claimed is:

1. A system for generating a structurally aware timing model for operation of a predetermined circuit design having at least one input terminal, at least one output terminal, and at least one component interconnected therebetween, the system comprising:
   a timing analysis unit executing to perform a timing analysis on the predetermined circuit design to generate a timing report including a set of operational timing characteristics respectively corresponding to a set of terminal pairs in the predetermined circuit design;
   a selection unit coupled to said timing analysis unit, said selection unit selecting from said set of terminal pairs at least one of each terminal pair having one of an input or output terminal;
   a model generation unit coupled to said timing analysis unit and said selection unit, said model generation unit executing to model operational timing of the predetermined circuit design, said model generation unit generating a timing arc indicative of delay in signal traversal between selected terminal pairs relative to a predetermined timing requirement thereof; and,
   a structural characterization unit coupled to said model generation unit, said structural characterization unit executing to selectively determine from the predetermined circuit design at least one preselected structural feature for each distinct signal path extending between each selected terminal pair, said structural characterization unit generating a structural weight indicative of said preselected structural feature for a representative one of the distinct signal paths selectively identified for each selected terminal pair;
   wherein a hybrid model is generated to include said timing arcs and said structural weights, each said structural weight being associated with one of said timing arcs;
   wherein said selection unit selects from said set of terminal pairs each terminal pair of a first, a second, or a third type, said first type pairing one said input terminal with one said output terminal, said second type pairing one said input terminal with one intermediate terminal defined by a component of memory type, and said third type pairing one of said intermediate terminals defined by a component of memory type with an output terminal.

2. The system as recited in claim 1, wherein said structural characterization unit generates a structural weight indicative of said preselected structural feature for a representative one of the distinct signal paths selectively identified for each selected terminal pair type.

3. The system as recited in claim 2, wherein said structural characterization unit generates a structural weight indicative of said preselected structural feature for a representative one of the distinct signal paths selectively identified for each selected terminal pair type for each distinct clock in the circuit design.

4. The system as recited in claim 1, wherein said structural characterization unit executes to selectively determine said preselected structural feature to include a number of stages for each distinct signal path, each stage being defined by an input terminal, a component, and an output terminal.

5. The system as recited in claim 4, wherein said structural characterization unit executes to rank said signal paths for each selected terminal pair according to said number of stages thereof; and to generate a structural weight for each terminal pair according to a comparison of said ranked signal paths.

6. The system as recited in claim 1, wherein said structural characterization unit executes to: selectively determine said preselected structural feature including a path distance for each distinct signal path; rank said signal paths according to said distance thereof; and generate a structural weight for each terminal pair according to a comparison of said ranked signal paths.

7. The system as recited in claim 1, wherein said structural characterization unit executes to: selectively determine said preselected structural feature including a number of transistors for each distinct signal path; rank said signal paths according to said number of transistors thereof; and generate a structural weight for each terminal pair according to a comparison of said ranked signal paths.

8. The system as recited in claim 1, wherein said timing analysis unit includes a static timing analysis (STA) engine, said timing analysis engine executing to generate said timing report to include a slack time for each terminal pair relating a signal arrival time to a predetermined required arrival time.

9. The system as recited in claim 1, wherein said second and third selected types of terminal pairs represent terminal pairs having an intermediate terminal defined by a register component or flip-flop component.

10. A method for generating a structurally aware timing model for operation of a predetermined circuit design having at least one input terminal, at least one output terminal, and at least one component interconnected therebetween, the method comprising:
   executing on a processor a timing analysis on the predetermined circuit design to generate a timing report including a set of operational timing characteristics respectively corresponding to a set of terminal pairs in the predetermined circuit design;
   selecting from said set of terminal pairs at least one of each terminal pair having one of an input or output terminal;
   modeling operational timing of the predetermined circuit design to generating a timing arc indicative of delay in signal traversal between selected terminal pairs relative to a predetermined timing requirement;
   selectively determining according to the predetermined circuit design at least one preselected structural feature for each distinct signal path extending between each selected terminal pair; and,
   generating a structural weight indicative of said preselected structural feature for a representative one of the distinct signal paths selectively identified for each selected terminal pair;

wherein a hybrid model is generated to include said timing arcs and said structural weights of selected terminal pairs, each said structural weight being associated with one of said timing arcs;

wherein said predetermined type includes terminal pairs of a first, a second, or a third type, said first type pairing one said input terminal with one said output terminal, said second type pairing one said input terminal with one intermediate terminal defined by a component of memory type, and said third type pairing one of said intermediate terminals defined by a component of memory type with an output terminal.

11. The method as recited in claim 10, further comprising generating a structural weight indicative of said preselected structural feature for a representative one of the distinct signal paths selectively identified for each selected terminal pair type.

12. The method as recited in claim 11, further comprising generating a structural weight indicative of said preselected structural feature for a representative one of the distinct signal paths selectively identified for each selected terminal pair type for each distinct clock in the circuit design.

13. The method as recited in claim 10, wherein said preselected structural feature includes a number of stages for each distinct signal path, each stage being defined by an input terminal, a component, and an output terminal.

14. The method as recited in claim 13, further comprising ranking said signal paths for each selected terminal pair according to said number of stages thereof; and generating a structural weight for each terminal pair according to a comparison of said ranked signal paths.

15. The method as recited in claim 10, wherein said preselected structural feature includes a path distance for each distinct signal path; ranking said signal paths according to said distance thereof; and generating a structural weight for each terminal pair according to a comparison of said ranked signal paths.

16. The method as recited in claim 10, wherein said preselected structural feature includes a number of transistors for each distinct signal path; ranking said signal paths according to said number of transistors thereof; and generating a structural weight for each terminal pair according to a comparison of said ranked signal paths.

17. The method as recited in claim 10, wherein said timing analysis unit includes a static timing analysis (STA) engine, said timing analysis engine executing to generate said timing report to include a slack time for each terminal pair relating a signal arrival time to a predetermined required arrival time.

18. A method for incorporating a structurally aware timing model for operation of a predetermined subordinate circuit design in a parent circuit design incorporating said timing model, the method comprising:

establishing a parent circuit design defined by physical implementation data including at least a set of first paths, each path having a structural characteristic thereof;

establishing said timing model of said subordinate circuit design, said timing model predefined to include a set of second paths therethrough with a respectively corresponding set of structural characteristics for each of said second paths through said subordinate circuit design;

establishing an hierarchical circuit design guided by a physical implementation data therefor, said hierarchical circuit design formed by coupling said parent circuit design with said timing model of said subordinate circuit design;

selectively interconnecting said first paths to said second paths according to said hierarchical circuit physical implementation data to form a set of hierarchical paths;

performing on a processor a timing analysis upon said hierarchical circuit design including said timing model of said subordinate circuit design to determine an operational timing characteristic for each of said hierarchical paths through said hierarchical circuit design;

determining a preselected structural feature of each of said hierarchical paths according to a corresponding structural characteristic weight indicative of one of said first paths and a corresponding structural characteristic of one of said second paths; and, applying an advanced on chip variation (AOCV) derate function to an operational timing characteristic for each of said hierarchical paths according to the corresponding structural characteristic weight therefor to reduce pessimism in said operational timing characteristic.

* * * * *